US007811625B2

(12) United States Patent
Ichikawa et al.

(10) Patent No.: US 7,811,625 B2
(45) Date of Patent: Oct. 12, 2010

(54) METHOD FOR MANUFACTURING ELECTRON-EMITTING DEVICE

(75) Inventors: Takeshi Ichikawa, Tokyo (JP); Ryoji Fujiwara, Kanagawa (JP); Daisuke Sasaguri, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 304 days.

(21) Appl. No.: 11/937,610

(22) Filed: Nov. 9, 2007

(65) Prior Publication Data

US 2008/0070468 A1 Mar. 20, 2008

Related U.S. Application Data

(62) Division of application No. 10/516,545, filed as application No. PCT/JP03/07544 on Jun. 13, 2003, now Pat. No. 7,733,006.

(30) Foreign Application Priority Data

Jun. 13, 2002 (JP) ............................ 2002-172213
Apr. 30, 2003 (JP) ............................ 2003-125030

(51) Int. Cl.
*B05D 5/12* (2006.01)
*B05D 3/02* (2006.01)
*C23C 14/14* (2006.01)

(52) U.S. Cl. ...................... 427/74; 427/372.2; 427/531

(58) Field of Classification Search ............ 427/74–78, 427/531, 372.2
See application file for complete search history.

(56) References Cited

U.S. PATENT DOCUMENTS 4,663,559 A 5/1987 Christensen ................ 313/336
4,904,895 A 2/1990 Tsukamoto et al. ......... 313/336
5,180,951 A 1/1993 Dworsky et al. ......... 315/169.3
5,283,501 A 2/1994 Zhu et al. ................ 315/169.3
5,786,658 A 7/1998 Tsukamoto et al. ......... 313/309
5,853,310 A * 12/1998 Nishimura et al. ............ 445/24
5,861,707 A 1/1999 Kumar ....................... 313/309
5,939,823 A 8/1999 Kiyomiya et al. ........... 313/495
5,952,772 A 9/1999 Fox et al. .................... 313/310
5,986,857 A 11/1999 Hirano et al. ............... 360/113
5,989,404 A 11/1999 Kiyomiya et al. ............. 205/96
6,008,502 A 12/1999 Deguchi et al. ............... 257/10
6,097,139 A 8/2000 Tuck et al. .................. 313/310
6,129,602 A 10/2000 Yamanobe ................... 445/24
6,267,636 B1 7/2001 Onishi et al. ................... 445/6

(Continued)

FOREIGN PATENT DOCUMENTS

EP 0 290 026 A1 11/1988

(Continued)

OTHER PUBLICATIONS

Lau et al. "Field emission from metal containg amorphous carbon composite films", Diamond and Related Materials, vol. 10 2001, pp. 1727-1731.*

(Continued)

*Primary Examiner*—Brian K Talbot
(74) *Attorney, Agent, or Firm*—Fitzpatrick, Cella, Harper & Scinto

(57) ABSTRACT

There is provided an electron-emitting device of a field emission type, with which the spot size of an electron beam is small, an electron emission area is large, highly efficient electron emission is possible with a low voltage, and the manufacturing process is easy. The electron-emitting device includes a layer 2 which is electrically connected to a cathode electrode 5, and a plurality of particles 3 which contains a material having a resistivity lower than that of a material constituting the layer 2, and is wherein a density of particles 3 in the layer 2 is $1\times10^{14}/cm^3$ or more and $5\times10^{18}/cm^3$ or less.

2 Claims, 23 Drawing Sheets

U.S. PATENT DOCUMENTS

| | | | | |
|---|---|---|---|---|
| 6,288,494 | B1 | 9/2001 | Tsukamoto et al. | 315/169.1 |
| 6,379,211 | B2 | 4/2002 | Onishi et al. | 445/73 |
| 6,435,928 | B1 | 8/2002 | Tsukamoto | 445/24 |
| 6,515,640 | B2 | 2/2003 | Tsukamoto et al. | 345/75.2 |
| 6,583,553 | B2 | 6/2003 | Sasaguri | 313/495 |
| 6,583,582 | B2 | 6/2003 | Ichikawa | 315/169.3 |
| 6,624,589 | B2 | 9/2003 | Kitamura et al. | 315/169.3 |
| 6,650,061 | B1 | 11/2003 | Urayama et al. | 315/169.3 |
| 6,683,408 | B2 | 1/2004 | Ichikawa | 313/495 |
| 6,686,679 | B1 | 2/2004 | Tuck et al. | 313/309 |
| 6,717,340 | B2 | 4/2004 | Nishimura | 313/310 |
| 6,752,676 | B2 * | 6/2004 | Yamashita et al. | 445/6 |
| 6,827,624 | B2 * | 12/2004 | Kurokawa et al. | 445/50 |
| 6,828,728 | B2 | 12/2004 | Ishii et al. | 313/512 |
| 6,840,835 | B1 | 1/2005 | Tuck | 445/50 |
| 6,861,790 | B1 | 3/2005 | Iwasa et al. | 313/346 |
| 6,876,007 | B2 | 4/2005 | Yamazaki et al. | 257/88 |
| 6,933,664 | B2 | 8/2005 | Kitamura et al. | 313/309 |
| 6,975,288 | B2 | 12/2005 | Nishimura et al. | 345/74.1 |
| 7,021,981 | B2 | 4/2006 | Onishi et al. | 445/6 |
| 7,074,102 | B2 | 7/2006 | Teramoto | 445/24 |
| 7,109,663 | B2 | 9/2006 | Fujiwara et al. | 315/169.4 |
| 7,259,520 | B2 | 8/2007 | Fujiwara et al. | 315/169.1 |
| 7,583,016 | B2 | 9/2009 | Nishimura et al. | 313/311 |
| 2002/0047562 | A1 | 4/2002 | Kitamura et al. | 315/169.3 |
| 2002/0057045 | A1 | 5/2002 | Tsukamoto | 313/309 |
| 2002/0097204 | A1 | 7/2002 | Tsukamoto et al. | 345/74.1 |
| 2003/0209992 | A1 | 11/2003 | Kitamura et al. | 315/169.3 |
| 2004/0251812 | A1 | 12/2004 | Fujiwara et al. | 313/495 |
| 2005/0017651 | A1 | 1/2005 | Nishimura | 315/169.3 |
| 2005/0202745 | A1 | 9/2005 | Nishimura | 445/5 |
| 2006/0061289 | A1 | 3/2006 | Fujiwara et al. | 315/169.1 |
| 2006/0066199 | A1 | 3/2006 | Ichikawa et al. | 313/311 |
| 2006/0252335 | A1 | 11/2006 | Onishi et al. | 445/6 |
| 2007/0054585 | A1 | 3/2007 | Teramoto | 445/51 |
| 2008/0012463 | A1 | 1/2008 | Fujiwara et al. | 313/310 |
| 2008/0070468 | A1 | 3/2008 | Ichikawa et al. | 445/51 |

FOREIGN PATENT DOCUMENTS

| | | | |
|---|---|---|---|
| EP | 1056110 | | 11/2000 |
| EP | 1 160 819 | A2 | 12/2001 |
| EP | 1 177 568 | | 2/2002 |
| GB | 2 304 989 | A | 3/1997 |
| JP | 4-131846 | | 5/1992 |
| JP | 08-180796 | * | 12/1994 |
| JP | 8-96703 | | 4/1996 |
| JP | 8-96704 | | 4/1996 |
| JP | 8-264109 | | 10/1996 |
| JP | 2654012 | | 5/1997 |
| JP | 9-199001 | | 7/1997 |
| JP | 10-223130 | | 8/1998 |
| JP | 11-510307 | | 9/1999 |
| JP | 2001-6523 | | 1/2001 |
| JP | 2001-101966 | | 4/2001 |
| JP | 2001-202870 | | 7/2001 |
| JP | 2002-56771 | | 2/2002 |
| JP | 2002-93305 | | 3/2002 |
| JP | 2002-522878 | | 7/2002 |
| JP | 2002-373569 | | 12/2002 |
| JP | 2003-500795 | | 1/2003 |
| JP | 2003-51243 | | 2/2003 |
| JP | 2003-92056 | | 3/2003 |
| JP | 2004-027243 | * | 1/2004 |
| WO | 99/028939 | | 6/1999 |
| WO | WO 00/10190 | | 2/2000 |
| WO | WO 00/70638 | | 11/2000 |
| WO | 03/046255 | | 6/2003 |
| WO | WO 03/107377 | A1 | 12/2003 |

OTHER PUBLICATIONS

Forest, R.D., et al., "A Study of Electron Field Emission as a Function of Film Thickness from Amorphous Carbon Films", *Applied Physics Letters*, vol. 73, No. 25, pp. 3784-3786 (1998).

Ding, Xing-zhao, et al., "Electron Field Emission from Ti-Containing Tetrahedral Amorphous Carbon Films Deposited by Filtered Cathodic Vacuum Arc", *Journal of Applied Physics*, vol. 88, No. 11, pp. 6842-6847 (2000).

Li, Y.J., et al., "Field Emission from Cobalt-Containing Amorphous Carbon Composite Films Heat-Treated in an Acetylene Ambient", *Applied Physics Letters*, vol. 77, No. 13, pp. 2021-2023 (2000).

Forbes, Richard G., "Low-Macroscopic-Field Electron Emission from Carbon Films and Other Electrically Nanostructured Heterogeneous Materials: Hypotheses about Emission Mechanism", *Solid-State Electronics* 45 pp. 779-808 (2001).

Lau, S.P., et al., "Field Emission from Metal-Containing Amorphous Carbon Composite Films", *Diamond and Related Materials* 10, pp. 1727-1731 (2001).

Bajic, S., et al., "Enhanced Cold-Cathode Emission Using Composite Resin-Carbon Coatings", *J. Phys., D: Appl. Phys*. 21, pp. 200-204, 1988).

Burden, A.P., et al., "Field Emitting Inks for Consumer-Priced Broad-Area Flat-Panel Displays", *J. Vac. Sci, Technol. B* 18(w), pp. 900-904 (1999).

Zhirnov et al., "Environmental Effect on the Electron Emission from Diamond Surfaces", J. Vac. Technol. B., 16(3), pp. 1118-1193 (1998).

Robertson, "Mechanisms of Electron Field Emission from Diamond, Diamond-like Carbon, and Nanostructured Carbon", J. Vac. Scie, Technol., B 17(2), pp. 659-665 (1999).

Hart et al., "Field Emission from Tetrahedral Amorphous Carbon as a Function of Surface Treatment and Substrate Material", Appl. Phys. Lett., vol. 74 No. 11, pp. 1594-1596 (1999).

Robertson, "Amorphous Carbon Cathodes for Field Emission Display", Thin Solid Films, 296, pp. 61-65 (1997).

Pierson, "Diamond-Like Carbon (DLC)", Handbook of Carbon, Graphite, Diamond and Fullerenes: Properties, Processing and Applications, Noyers Publications, USA, pp. 337-355 (1993).

Shim, Jae Yeob, Structural, Optical, and Field Emission Properties of Hydrogenated Amorphous Carbon Films Grown by Helical Resonator Plasma Enhanced Chemical Vapor Deposition, Jpn. J. Appl. Phys. vol. 37 (19983) pp. 440-444.

European Patent Office Office Action dated Mar. 25, 2010.

* cited by examiner

METHOD FOR MANUFACTURING ELECTRON-EMITTING DEVICE

RELATED APPLICATIONS

This is a divisional of application Ser. No. 10/516,545, filed Dec. 2, 2004, which is the national phase of PCT/JP03/07544, filed Jun. 13, 2003, which in turn claims priority benefit under 35 U.S.C. §119 of Japanese patent applications 2002/172213, filed Jun. 13, 2002, and 2003/125030, filed Apr. 30, 2003. The entire disclosure of each of the mentioned applications is incorporated herein by reference.

TECHNICAL FIELD

The present invention relates to an electron-emitting device using an electron-emitting film, an electron source having a plurality of electron-emitting devices arranged therein, and an image display apparatus constituted by using the electron source.

BACKGROUND ART

In the case of applying an electron-emitting device using an electron-emitting film to an image display apparatus using phosphors, the electron-emitting device must produce an emission current sufficient for irradiating the phosphors with sufficient luminance. In addition, the size of the electron beam irradiated on the phosphors must be smaller as a higher resolution (definition) of the image display apparatus (display) is desired. Moreover, it is important that the apparatus itself is easily manufactured.

A cold cathode electron source, which is one type of the electron-emitting device, includes a field emission type (hereinafter referred to as "FE type"), a surface conduction electron-emitting device, or the like.

For the FE type, a Spindt type is highly efficient and expected. However, an electron-emitting device of the Spindt type has a complicated manufacturing process and, moreover, tends to disperse the electron beam it produces. Thus, it is necessary to arrange a focusing electrode above an electron-emitting part in order to prevent spreading of the electron beam.

On the other hand, examples of an electron-emitting device with which the spot size of an electron beam does not increase so much as with the Spindt type, are disclosed in, for example, JP 08-096703 A, JP 8-096704 A, JP 8-264109 A, and the like. Those electron-emitting devices cause electrons to be emitted from a flat thin film (electron-emitting film) arranged in a hole thereof. Thus, a relatively flat equipotential surface is formed on the electron-emitting film and widening of the electron beam is reduced, while the electron-emitting devices can be manufactured relatively easily. In addition, reduction of a drive voltage necessary for electron emission can be realized by using a material of a low work function as a substance forming the electron-emitting film. Moreover, the electron emission is performed in a planar shape (in the Spindt type, it is performed in a dot shape), so that concentration of electric fields can be relaxed. Thus, long life of the electron-emitting device can be realized. A carbon based electron-emitting film has been proposed as such a flat electron-emitting film. An electron-emitting device using a carbon based film is disclosed in, for example, "A Study of Electron Field Eemission as a Function of Film Thickness from Amorphous Carbon Films", R. D. Forrest et al., *Applied Physics Letters*, Volume 73, Number 25, 1988, P3784, and the like. Further, examples of carbon films having various metals added therein are disclosed in, for example, "Electron Field Emission from Ti-Containing Tetrahedral Amorphous Carbon Films Deposited by Filtered Cathodic Vacuum Arc", X. Z. Ding et al., *Journal of Applied Physics*, Volume 88, Number 11, 2000, P6842; "Field Emission from Cobalt-Containing Amorphous Carbon Composite Films Heat-Treated in an Acetylene Ambient", Y. J. Li et al., *Applied Physics Letters*, Volume 77, Number 13, 2000, p2021; "Low-Macroscopic-Field Electron Emission from Carbon Films and Other Electrically Nanostructured Heterogeneous Materials: Hypotheses About Emission Mechanism", Richard G. Forbes, *Solid-State Electronics* 45 (2001) pp. 779-808; "Field Emission from Metal-Containing Amorphous carbon Composite Films", S. P. Lau et al., *Diamond Related Materials,* 10 (2001) pp. 1727-1731; JP 2001-006523 A; JP 2001-202870 A; and the like.

In addition, electron-emitting films using a conductive material and an insulating material are studied in various ways. Such electron-emitting films are disclosed in, for example, "Enhanced Cold-Cathode Emission Using Composite Resin-carbon Ccoatings", S. Bajic and R. v. Latham., *J. Phys. D: Appl. Phys.,* 21 (1988) pp. 200-204; "Field Emitting Inks for Consumer-Priced Broad-Area Flat-Panel Displays", A. P. Burden et al., *J. Vac. Sci. Technol. B,* 18 (2), March/April (2000) pp. 900-904; Japanese Utility Model Application Laid-open No. 04-131846; and the like. Moreover, there are reports on electron-emitting films such as one in which a conductive material is added in pores of an insulating material as disclosed in JP 2001-101966 or one in which, in a cermet of ceramics and metal, electrons are injected into an insulating layer from the metal to emit the electrons as disclosed in U.S. Pat. No. 4,663,559.

DISCLOSURE OF INVENTION

FIG. 18 shows an example in which an electron-emitting device is applied as an image display apparatus 1000. Lines of a gate electrode layer 1002 and lines of a cathode electrode layer 1004 are arranged on a substrate 1001 in a matrix shape, and electron-emitting devices 1014 are arranged in crossing parts of the lines (where the lines cross). Electrons are emitted from the electron-emitting device 1014 placed in a selected crossing part according to an information signal, and accelerated by a voltage of an anode 1012 to be incident to the phosphors 1013. Such a device is a so-called triode device. Note that reference numeral 1003 denotes an insulating layer.

In the case in which the application to the image display apparatus is considered with a field emission electron-emitting device, it is demanded that the following requirements are satisfied simultaneously:

(1) a spot size of an electron beam (electron beam diameter) is small;

(2) an electron-emitting area is large;

(3) an electron emission site density (ESD) is high and a current density is high;

(4) highly efficient electron emission is possible with a low voltage; and (5) a manufacturing process is easy.

However, the above-mentioned conventional device using an electron-emitting film cannot always be realized in a state in which the above-mentioned requirements can be satisfied simultaneously.

Therefore, the present invention has been devised in order to solve the above-mentioned problems of the conventional art, and it is an object of the present invention to provide: a field emission electron-emitting device with which the spot size of an electron beam (electron beam diameter) is small, an electron-emitting area is large, highly efficient electron emission is possible with a low voltage, and a manufacturing process is easy; and an electron source and an image display apparatus utilizing such electron-emitting device.

A construction of the present invention devised for attaining the above-mentioned object is as described below.

That is, according to the present invention, there is provided an electron-emitting device including: a cathode electrode; a layer electrically connected to the cathode electrode; and a plurality of particles comprising as a main component a material which has resistivity lower than resistivity of a material of the layer, wherein the plurality of particles are arranged in the layer; and a density of the particles in the layer is $1\times10^{14}/cm^3$ or more and $5\times10^{18}/cm^3$ or less.

Further, according to the present invention, there is provided an electron-emitting device including: a cathode electrode; a layer electrically connected to the cathode electrode; and a plurality of particles comprising a material, which has resistivity lower than resistivity of a material of the layer, as a main component, wherein the plurality of particles are arranged in the layer; and a concentration of a main element of the particles with respect to a main element of the layer is 0.001 atm % or more and 1.5 atm % or less.

Further, according to the present invention, there is provided an electron-emitting device including: a cathode electrode; a layer electrically connected to the cathode electrode; and a plurality of particles comprising as a main component a material which has resistivity lower than resistivity of a material of the layer, wherein the plurality of particles are arranged in the layer; a density of the particles in the layer is $1\times10^{14}/cm^3$ or more and $5\times10^{18}/cm^3$ or less; and a concentration of a main element of the particles with respect to a main element of the layer is 0.001 atm % or more and 1.5 atm % or less.

Further, according to the present invention, there is provided an electron-emitting device including: a cathode electrode; a layer which is arranged on the cathode layer and contains carbon as a main component; and at least two particles which are arranged so as to be adjacent to each other in the layer and each comprises metal as a main component, wherein one of the adjacent two particles is arranged to be nearer to the cathode electrode than the other particle; and the metal is metal selected from Co, Ni, and Fe.

Further, according to the present invention, there is provided an electron-emitting device including: a cathode electrode; and a layer connected to the cathode electrode, wherein a plurality of groups of particles, each group being constituted by at least two particles adjacent to each other, are arranged in the layer; the particles comprises as a main component a material which has resistivity lower than resistivity of a material of the layer, the adjacent two particles are arranged in a range of 5 nm or less; one of the adjacent two particles is arranged to be nearer to the cathode electrode than the other particle; and the plurality of groups of particles are arranged apart from each other by an average film thickness of the layer or more.

Further, according to the present invention, there is provided an electron-emitting device including: a cathode electrode; and a layer connected to the cathode electrode, wherein a plurality of groups of particles, each group being constituted by at least two particles which comprises metal as a main component and are adjacent to each other, are arranged in the layer; the layer comprises as a main component a material which has resistivity higher than resistivity of the particles comprising metal as a main component; the adjacent two particles are arranged in a range of 5 nm or less; and one of the adjacent two particles is arranged to be nearer to the cathode electrode than the other particle.

Further, according to the present invention, there is provided an electron-emitting device including: a cathode electrode; and a layer which is connected to the cathode electrode and comprises carbon as a main component, wherein a plurality of groups of particles, each group being constituted by at least two particles which comprises metal as a main component and are adjacent to each other, are arranged in the layer; the plurality of groups of particles are arranged apart from each other by an average film thickness of the layer or more; and a concentration of the metal in the carbon layer is lower on a surface side of the carbon layer than on the cathode electrode side.

Further, according to the present invention, there is provided an electron-emitting device including: a cathode electrode; and a layer which is connected to the cathode electrode and comprises carbon as a main component, wherein a plurality of groups of particles, each group being constituted by two particles which comprises metal as a main component and are adjacent to each other, are arranged in the layer, one of the adjacent two particles is arranged to be nearer to the cathode electrode than the other particle; and graphen is included between adjacent particles in at least part of the plurality of particles.

Further, according to the present invention, there is provided an electron-emitting device including: a cathode electrode; a layer which is electrically connected to the cathode electrode and comprises carbon as a main component; and a plurality of conductive particles arranged in the layer comprising carbon as a main component, wherein the layer comprising carbon as a main component contains a hydrogen element of 0.1 atm % or more with respect to a carbon element.

According to the electron-emitting device of the present invention, it is preferable that the layer comprising carbon as a main component contains a hydrogen element of 1 atm % or more and 20 atm % or less with respect to a carbon element.

Further, it is preferable that surface unevenness of the layer is smaller than 1/10 of its film thickness in rms.

Further, it is preferable that the layer contains carbon as a main component.

Further, it is preferable that an average concentration of hydrogen with respect to carbon in the layer is 0.1 atm % or more.

Further, it is preferable that the layer comprising carbon as a main component has an $sp^3$ bonding.

Further, it is preferable that the particles contain metal as a main component.

Further, it is preferable that the metal is metal selected from Co, Ni, and Fe.

Further, it is preferable that the particles comprise monocrystal metal as a main component.

Further, it is preferable that the particles have an average particle diameter of 1 nm or more to 10 nm or less.

Further, it is preferable that the layer has a thickness of 100 nm or less.

Further, it is preferable that at least two adjacent particles among the plurality of particles are arranged 5 nm or less apart from each other.

Further, it is preferable that a density of the particles in the layer is $1\times10^{14}/cm^3$ or more and $5\times10^{18}/cm^3$ or less, in particular, $1\times10^{15}/cm^3$ or more and $5\times10^{17}/cm^3$ or less.

Further, it is preferable that a concentration of a main element of the particles with respect to a main element of the layer is 0.001 atm % or more and 1.5 atm % or less, in particular, 0.05 atm % or more and 1 atm % or less.

Further, it is preferable that: a plurality of particles are arranged dispersedly in the layer as a plurality of groups of particles, each group being constituted by at least two adjacent particles; one of the two adjacent particles are placed to be nearer to the cathode electrode than the other particle; and the plurality of groups of particles are arranged apart from each other by an average film thickness of the layer or more.

Further, the electron-emitting device of the present invention further includes: an insulating film which is arranged on the cathode electrode and has a first opening; and a gate electrode which is arranged on the insulting film and has a second opening, and it is preferable that: the first opening and the second opening communicate with each other; and the layer is exposed in the first opening.

Further, according to the present invention, there is provided an electron source, wherein a plurality of the electron-emitting devices of the present invention are arranged.

Further, according to the present invention, there is provided an image display apparatus, characterized by including: the electron source of the present invention; and a light-emitting member which emits light by being irradiated with electrons.

Further, according to the present invention, there is provided a manufacturing method for an electron-emitting device, characterized by including: forming a layer which comprises metal and a material having resistivity higher than that of the metal as a main component; and heating the layer in an atmosphere containing hydrogen.

According to the manufacturing method of the present invention, it is preferable that the atmosphere containing hydrogen further contains hydrocarbon.

Further, it is preferable that the hydrocarbon is acetylene.

Further, it is preferable that the metal is a VIII group element.

Further, it is preferable that the metal is selected from Co, Ni, and Fe.

Further, it is preferable that a heat treatment temperature in the heating is 450° C. or more.

Further, it is preferable that the layer comprising a material having resistivity higher than that of the metal as a main component is a layer containing carbon as a main component.

Further, it is preferable that the metal is contained in the layer comprising carbon as a main component before the heating at a ratio of 0.001 atm % or more and 5 atm % or less, in particular, 0.001 atm % or more and 1.5 atm % or less, with respect to the carbon element.

Further, it is preferable that the film comprising carbon as a main component before the heating has an $sp^3$ bonding.

According to the present invention described above, electron emission with a high density and stable of a current to be emitted in a low electric field can be obtained and, at the same time, an electron beam of high resolution can be realized. Moreover, an electron-emitting device exhibiting the above effects can be realized easily. Thus, in an electron source and an image display apparatus to which the electron-emitting device of the present invention is applied, a high performance electron source and image display apparatus can be obtained.

BEST MODE FOR CARRYING OUT THE INVENTION

The preferred embodiment modes of the present invention will be hereinafter described illustratively in detail with reference to the accompanying drawings. Note that dimensions, materials, shapes and relative arrangements of components described in the following embodiment modes are not meant to limit the scope of the present invention unless specifically described otherwise.

Figure 1:
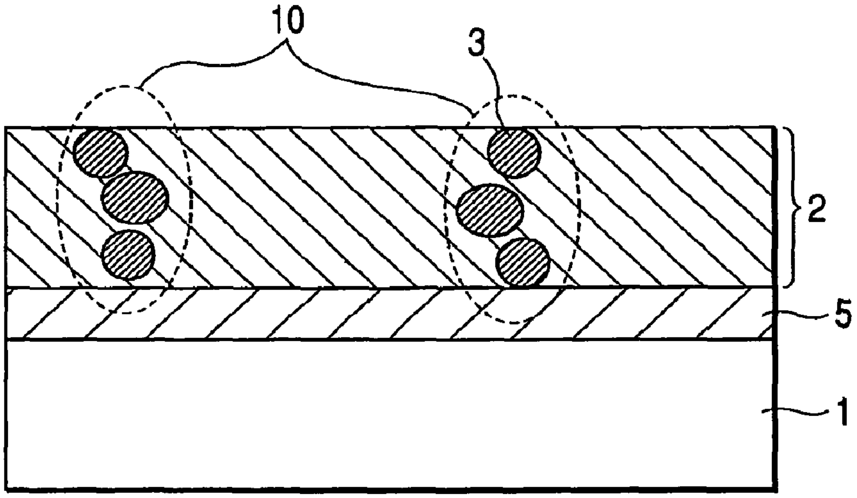
FIG. 1 is a schematic sectional view showing a structure of an electron-emitting device in accordance with the present invention.

FIG. 1 shows a schematic partial sectional view of an example of an electron-emitting device of the present invention. In FIG. 1, reference numeral 1 denotes a substrate; 2, a layer containing a plurality of particles 3; and 5, a cathode electrode. It is preferable to arrange a resistance layer between the cathode electrode 5 and the layer 2 as required.

Figure 16A:
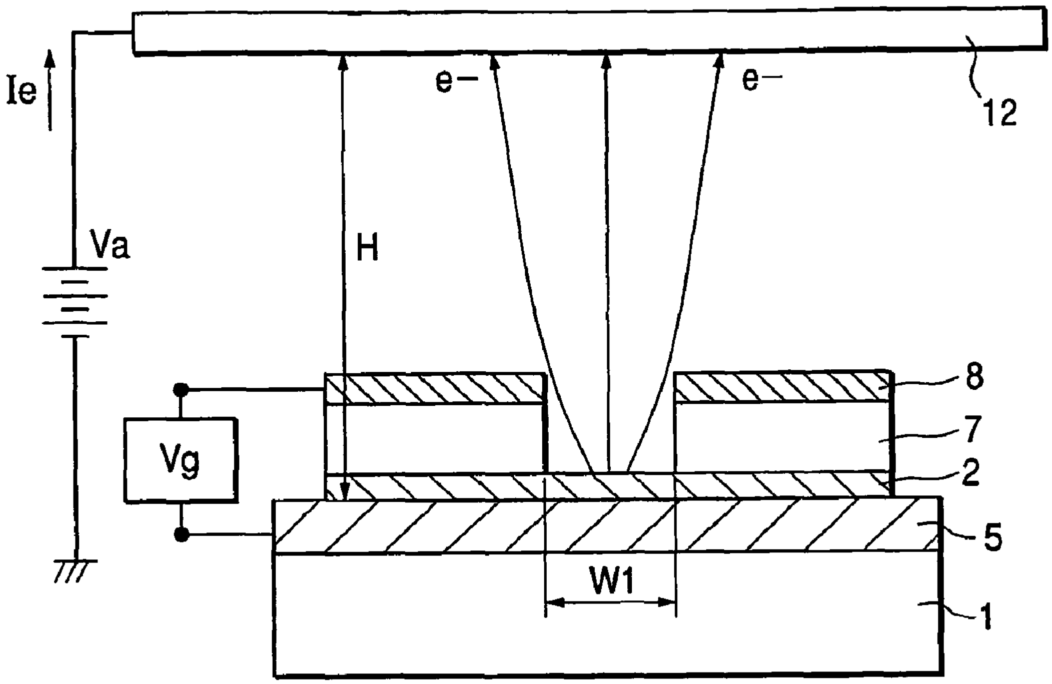
FIGS. 16A and 16B are a schematic sectional view and a schematic plan view, respectively, showing the electron-emitting device in accordance with the present invention.
Figure 16B:
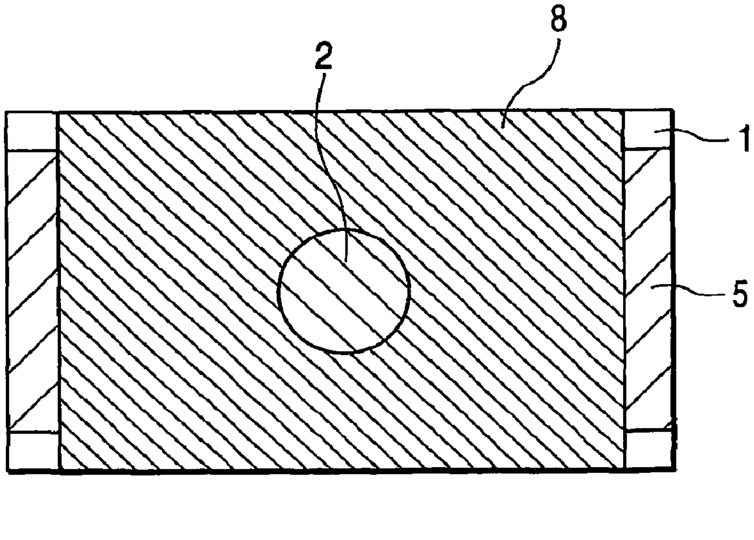

In an electron-emitting apparatus (including an image display apparatus) using the electron-emitting device of the present invention, for example, as shown in FIGS. 16A and 16B, a triode structure is generally adopted. In the triode structure, usually, an anode electrode 12 is arranged so as to be substantially parallel with the surface of the substrate 1, on which the electron-emitting device (the cathode electrode 5 and the layer 2) is arranged, and a gate electrode (electron extracting electrode) 8 is further arranged between the anode electrode 12 and the layer 2 constituting the electron-emitting device, thereby driving the device. Upon driving, a potential, which is higher than that applied to the cathode electrode 5, is applied to the gate electrode 8, whereby electrons are emitted from the layer 2 in a substantially vertical direction with respect to the surface of the substrate 1. Note that, although the example of the electron-emitting device of the triode structure is described here, it is also possible to remove the gate electrode 8 (and insulating layer 7) in FIGS. 16A and 16B and use the anode electrode 12 as an electron extracting electrode by applying a potential for drawing electrons from the layer 2. Such a structure is a so-called “diode structure”.

The resistivity of a main component of the layer 2 containing the plurality of particles 3 is set higher than the resistivity of the particles 3. Thus, basically, the main body of the layer 2 is constituted by a dielectric body and a main body of the particles 3 is constituted by a conductor. By setting the resistivity of the main body of the layer 2 to be 100 times or more that of the main body of the particles 3, electron emission can be performed in a lower electric field.

In addition, as a material to be the main body of the layer 2 containing the plurality of particles 3, a material having smaller dielectric constant is preferable when only electric field concentration, which is described later in detail, is taken into account. However, when it is taken as an electron-emitting material, preferably, carbon is used. In addition, in the case in which carbon is used, it is preferable that the layer 2 has both $sp^2$ bonding and an $sp^3$ bonding therein. In particular, a carbon film having a micro-structure of graphite (graphene) and a band structure containing the $sp^3$ bonding is originally low in electric field concentration and favorable in an electron-emitting characteristic. Thus, the above-mentioned carbon film is used as the main body of the layer 2 and, moreover, the particles 3 are arranged in the layer 2 in a structure to be described later, whereby a further effect of electric field concentration can be additionally achieved and, in particular, a preferable electron-emitting characteristic can be realized. However, as described above, it is important that the layer 2 has high resistance, substantially functioning as an insulating body. Thus, it is preferable that a main body of the carbon film is an amorphous carbon such as diamond-like-carbon (DLC) because resistivity in the order of $1\times10$ to $1\times10^{14}$ Ω cm can be obtained, and the carbon film can function as a dielectric body.

On the other hand, the particles 3 preferably contain metal as a main body thereof and, more specifically, contain a VIII group element. Moreover, in the case in which the main body of the layer 2 is carbon, the material of the particles 3 is preferably a metal selected from among Ni, Fe, and Co and, in particular, Co is preferable. Since there is a lesser band barrier between Ni, Fe, or Co and carbon, the obstacle to electron injection is less. In addition, the particles 3 preferably have a monocrystal (single crystal) of the metal as the main body in the interest of realizing a larger emission current density. In addition, stable electron emission becomes possible in a further lower electric field and the electron-emitting characteristic becomes more preferable as graphene, which is the microstructure of graphite, is arranged around the particles 3 (in particular, between adjacent particles). Further, it is preferable to use Ni, Fe, or Co as the main body of the particles and use carbon as the main body of the layer 2 because, in the case in which the electron-emitting device of the present invention is produced through “cohesion (agglomeration)” to be described later, since graphitization of carbon, which is the element constituting the layer 2, is easily grown by heat treatment at a low temperature, a conduction path and the microstructure of graphite can be formed easily.

In the present invention, the plurality of particles 3 is not always dispersed uniformly in the layer 2. As schematically shown in FIG. 1, the plurality of particles 3 form aggregates (groups of particles) 10 to some extent and, the aggregates (groups of particles) 10 are arranged discretely in the layer 2. A distance among the respective aggregates (groups of particles) 10 is preferably equal to or more than an average film thickness of the layer 2. Note that the average film thickness of the layer 2 is defined with the surface of the cathode electrode 5 (or the surface of the substrate 1) as a reference. More specifically, the distance among the respective aggregates (groups of particles) 10 is equal to or more than the average film thickness of the layer 2 and, preferably, 1.5 time or more to 1000 times or less thereof. In a range exceeding this, it becomes difficult for the electron emission site density (ESD) in the layer 2 to satisfy a characteristic of the electron-emitting device required of an image display apparatus.

In this way, the respective aggregates (groups of particles) 10 are sufficiently apart from each other, whereby a threshold value for electron emission can be reduced. This is because, as the aggregates (groups of particles) 10 are apart from each other, there is an effect of increasing electric field concentration to the respective aggregates (groups of particles) 10. Note that, in the present invention, the particles 3, which do not form the aggregates 10, may exist among the respective aggregates (groups of particles) 10.

Further, the plurality of particles constituting the respective aggregates (groups of particles) 10 are arranged so as to be substantially aligned in a film thickness direction of the layer 2 (direction toward the surface side of the layer 2 from the cathode electrode 5 side). According to such a structure, electric field can be concentrated in the respective aggregates 10.

In the present invention, the number of particles 3 aligned in the film thickness direction of the layer 2 is not limited and only has to be at least two or more. For example, it is sufficient that two particles are aligned in the film thickness direction of the layer 2 with one of the adjacent two particles arranged in a position closer to the surface of the cathode electrode 5 (or the surface of the layer 2) than the other. However, in further reducing the threshold value for electron emission, it is preferable that the other particle is arranged in a position closer to the surface of the cathode electrode 5 (or the surface of the layer 2) than a central position of the one particle and, moreover, the other particle is arranged in an area between the one particle and the surface of the cathode electrode 5 (or the surface of the layer 2). In the present invention, the particles 3 are preferably aligned vertically with respect to the surface of the cathode electrode 5 (surface of the layer 2) but are not necessarily limited to such an arrangement.

In addition, in the present invention, the adjacent particles are preferably arranged within a range of 5 nm or less. When this range is exceeded, the threshold value for electron emission starts to increase extremely and it also becomes difficult to obtain a sufficient emission current. Further, in the respective aggregates (groups of particles), the adjacent particles 3 may be in contact with each other. It is not desirable that the distance among the particles 3 exceeds the average particle diameter thereof because the electric field concentration is less likely to occur. In addition, as in the present invention, since the conductor contained in the layer 2 is a particulate, even if the adjacent particles are in contact with each other, resistance between the adjacent particles increases. Thus, it is surmised that extreme increase in an emission current at individual electron emission site existing in the layer 2 can be suppressed, and electron emission can be performed stably.

Further, in the present invention, it is preferable that the particles 3 are substantially embedded in the layer 2 completely but may be partially exposed from the surface of the layer 2. Thus, unevenness of the surface of the layer 2 is preferably one tenth or less of the average film thickness of the layer 2 in "rms". "rms" is defined as Japanese Industrial Standard. With this structure, dispersion of an electron beam due to surface roughness of the layer 2 can be suppressed as much as possible. In addition, according to the above-mentioned structure, since the surfaces of the particles 3 are less likely to be affected by influence of gas existing in the vacuum, it is surmised that the structure contributes also to stable electron emission.

According to the electron-emitting device of the above-mentioned constitution of the present invention, it is surmised that a conduction path of the conductor particles 3 is formed partially (discretely). Thus, pre-processing such as conditioning, which has been conventionally required of a carbon film with a flat surface, becomes unnecessary, and satisfactory electron emission can be realized without suffering partial destruction or damage. However, when the particles are dispersed uniformly over solely the conduction path, that is, the entire layer 2, the threshold value for electron emission increases. In addition, when the distance among the respective aggregates (groups of particles) 10 increases excessively, the electron emission current necessary for the electron-emitting device used in the display and the electron emission site density necessary for stably flowing the electron emission current cannot be obtained. As a result, stable electron emission and stable display image cannot be obtained. For this reason, the density of the particles 3 in the layer 2 is preferably $1\times10^{14}/cm^3$ or more and $5\times10^{18}/cm^3$ or less. Moreover, if the density is $1\times10^{15}/cm^3$ or more and $5\times10^{17}/cm^3$ or less, electron emission in a lower electric field can be realized. In addition, due to the same reason, a practical range of a concentration of a main element constituting the particles 3 with respect to a main element constituting the layer 2 is in a range of 0.001 atm % or more and 1.5 atm % or less. Moreover, when the concentration is 0.05 atm % or more and 1 atm % or less, electron emission in a lower electric field can be realized. When the concentration exceeds the above-mentioned range, as described above, the threshold value for electron emission increases. Further, the drive voltage to be applied increases and, as a result, breakdown may be caused, or a sufficient electron emission site density cannot be obtained. Thus, an emission current density necessary for an image display apparatus cannot be secured.

Figure 3A:
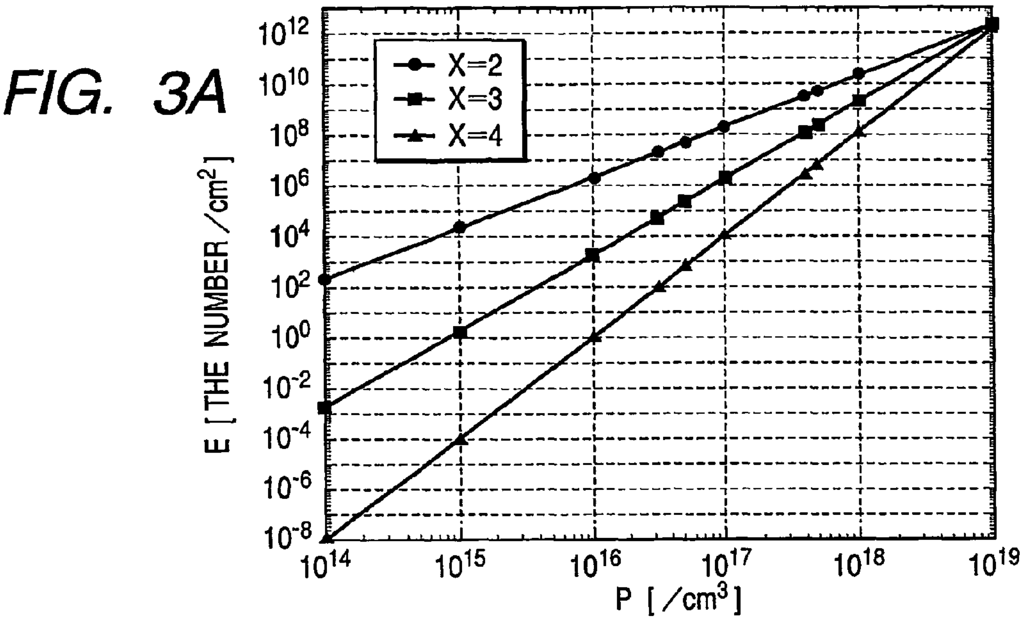
FIGS. 3A and 3B are explanatory graphs of the embodiment mode in accordance with the present invention.
Figure 3B:
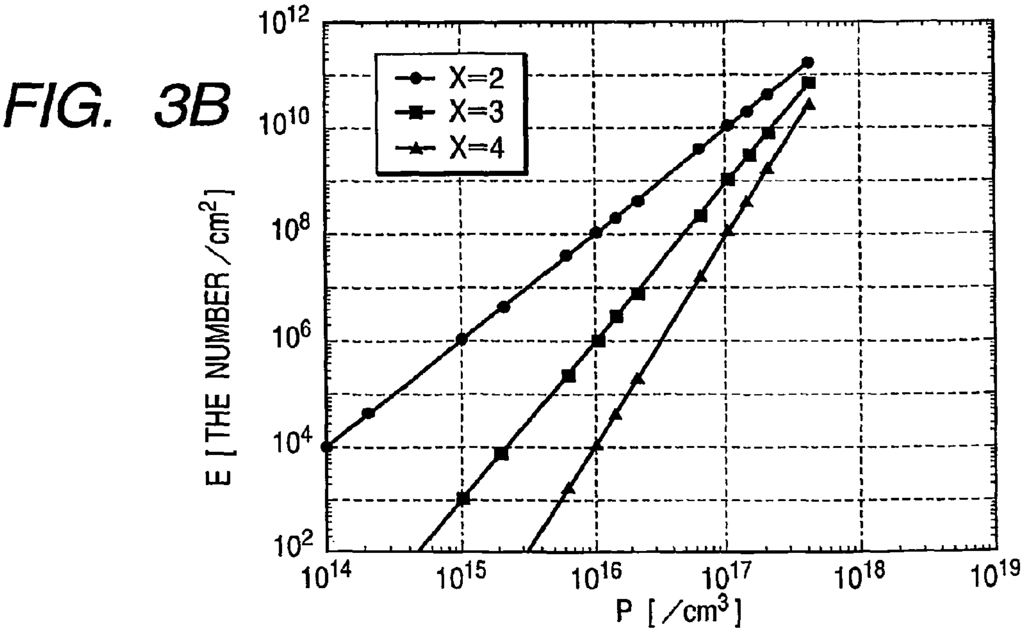

Here, the above-mentioned range of numerical values will be described. The number of aggregates (groups of particles) 10 existing in the layer 2 is shown in FIGS. 3A and 3B as a function of a density of particles. Note that "X" is the number of particles constituting one aggregate (a group of particles).

When it is assumed that the density of the particles 3 in the layer 2 is $P/cm^3$, the film thickness of the layer 2 is h, and the average radius of the particles is r, the number E of areas where the particles 3 continue in the film thickness direction (aggregates 10) is $2rP(8r^3P)^{(h/2r-1)}/cm^2$. FIG. 3A is a graph at the time when r=2 nm and FIG. 3B is a graph at the time when r=5 nm. Note that, here, "r" indicates a value of a half of the average particle diameter of the particles 3, and the average particle diameter of the particles 3 is preferably 1 nm or more and 10 nm or less as described later in detail.

It is desirable to set the density to a density with which electric field concentration can occur in the groups of particles 10 and to set E to be large. In order for two or more particles 3 to overlap for electric field concentration and for the number E thereof to become $1\times10^2/cm^2$ or more and, preferably, $1\times10^4/cm^2$ or more, it is sufficient that $P=1\times10^{14}/cm^3$ is satisfied in the case of r=2 nm. In addition, in order for E to become $1\times10^4$/cm or more, it is sufficient that at least $P=1\times10^{14}/cm^3$ is satisfied in the case of r=5 nm. On the other hand, when P exceeds $5\times10^{18}/cm^3$, there are too many particles 3, and the layer 2 becomes a mere conductor or electric field concentration to the aggregates 10 is less likely to occur. Thus, the ESD decreases and the current density also decreases, which is not preferable for the electron-emitting characteristic.

When the size of the particles 3 is controlled to several nm and the film thickness of the layer 2 is assumed to be several tens nm, it is preferable that the range of P is $1\times10^{14}/cm^3 \leqq P \leqq 5\times10^{18}/cm^3$, although this depends upon the film thickness of the layer 2 and the size of the particles 3. In the case in which the average particle diameter (2r) of the particle 3 is 1 to 10 nm and the particles 3 contain Co as a main body, a Co concentration in the layer 2 satisfying the above-mentioned conditions is 0.001 to 1.5 atm %.

Ideally, the range of P is preferably $1\times10^{15}/cm^3 \leqq P \leqq 5\times10^{17}/cm^3$. For example, in the example of FIGS. 3A and 3B, in the case in which the respective aggregates 10 are formed by two or more particles overlapping, the number E of the aggregates 10 is $1\times10^4/cm^3$ or more and $1\times10^{10}/cm^3$ or less.

Figure 2:
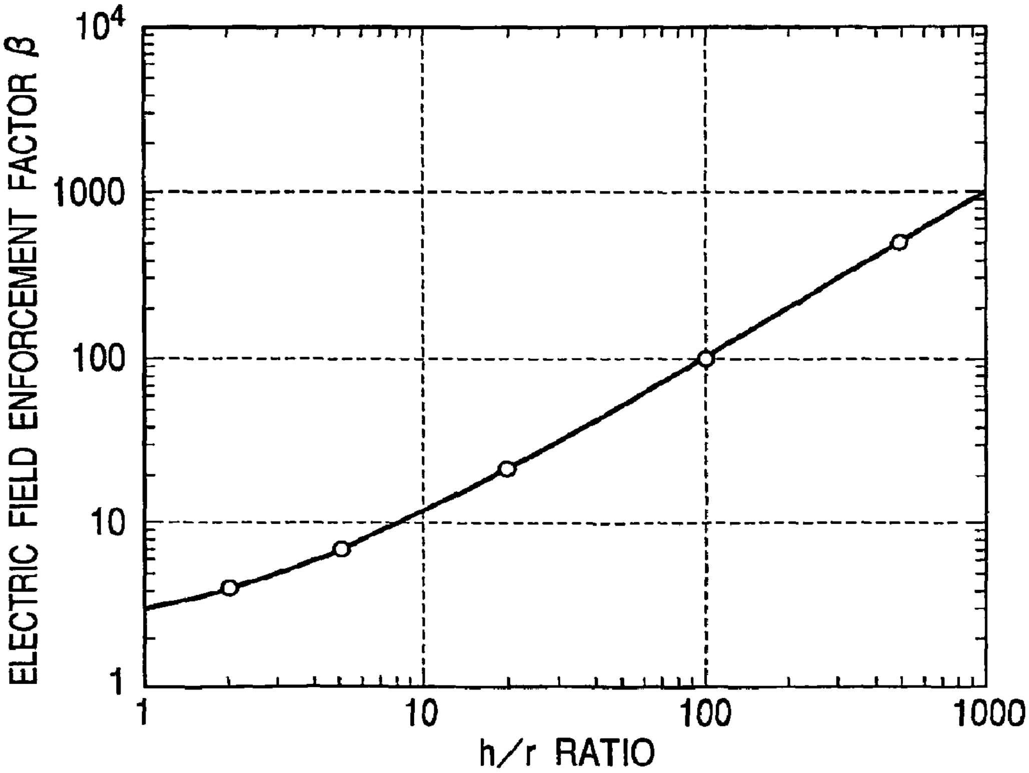
FIG. 2 is an explanatory graph of an embodiment mode in accordance with the present invention.

Here, electric field concentration will be described using FIG. 2. When it is assumed that a height of a conduction path is h, a radius of an electron-emitting part is r, electric field concentration (2+h/r) as large occurs and, moreover, similar electric field concentration of an electric field concentration factor β occurs due to a micro-shape of a tip thereof, and electric field concentration of a multiplication of them (2+h/r)β occurs as a whole. Therefore, it is possible that, by adopting the above-mentioned form, an electron-emitting film with which electron emission is performed more easily can be constituted in the electron-emitting device of the present invention.

On the other hand, a shape of a beam to be emitted is important in forming a non-divergent beam in the case in which the film thickness of the layer 2 is as thin as 100 nm or less, although this depends upon the film thickness of the layer 2, the size and shape of the particles 3, and the design of an electric field or the like. Moreover, the layer 2 has little structural stress and is suitable for a thin film process. When the size of the particles 3 is increased and the film thickness increases at the same ratio, the distance among the respective groups of particles 10 also increase and the number of electron emission sites per unit area decreases. The size of the particles 3 with respect to the small film thickness of 100 nm or less is ideally several nm (1 nm or more and 10 nm or less), and the particles 3 preferably have a form in which several particles are arranged from the cathode electrode side toward the surface of the electron-emitting film.

Moreover, it is advisable to mix hydrogen in the layer 2 in order to relax a stress of the layer 2. For example, the layer 2 containing carbon such as diamond-like-carbon (DLC) has high hardness and strong stress. Therefore, the layer 2 does not always have satisfactory compatibility to a process including heat treatment. There is also a problem in that, although it has a high quality as an electron-emitting film, it cannot be used as an electron-emitting device and an electron source in the case in which it is unstable in terms of process. It is also important that a film which is stable in process manufacturing can be formed according to stress relaxation with hydrogen. Consequently, in the case in which the main body of the layer 2 is carbon, stress relaxation can be caused by containing a hydrogen element of 0.1 atm % or more with respect to a carbon element in the layer 2. In particular, when the hydrogen element of 1 atm % or more is contained, this relaxation is strong, and hardness and Young's modulus can be reduced. However, when the ratio of the hydrogen element with respect to the carbon element exceeds 20 atm %, the electron-emitting characteristic starts to deteriorate. Therefore, a substantial upper limit is 20 atm %.

Next, a manufacturing process of the electron-emitting device of the present invention will be described. However, it is needless to mention that this structure itself is an example and is not specifically limited.

An example of a manufacturing method of the electron-emitting device in accordance with an embodiment mode of the present invention will be described with reference to FIGS. 4A to 4D. It is needless to mention that the present invention is not limited to this manufacturing method. In particular, an order of deposition and an etching method according to a difference of a structure are not limited, which will be described separately in an embodiment.

(Step 1)

First, in advance, one of: a laminated body formed by laminating $SiO_2$ on glass, soda lime glass, silicon substrate, or the like, a surface of which is cleaned sufficiently and with content of impurity such as quartz glass, Na, or the like reduced, by a sputtering method or the like; and an insulating substrate of ceramics such as aluminum is used as the substrate 1 to laminate the cathode electrode 5 on the substrate 1.

The cathode electrode 5 generally has electrical conductivity and is formed by a general vacuum deposition technique such as a vapor deposition method or a sputtering method. A material of the cathode electrode 5 is appropriately selected from, for example, a metal or alloy material such as Be, Mg, Ti, Zr, Hf, V, Nb, Ta, Mo, W, Al, Cu, Ni, Cr, Au, Pt, or Pd, a carbide such as Tic, ZrC, HfC, TaC, SiC, or WC, a boride such as $HfB_2$, $ZrB_2$, $LaB_6$, $CeB_6$, $YB_4$, or $GdB_4$, a nitride such as TiN, ZrN, or HfN, a semiconductor such as Si or Ge, amorphous carbon, graphite, diamond-like-carbon, carbon with diamond dispersed therein, a carbon compound, and the like. A thickness of the cathode electrode 5 is set in the range of several tens of nm to several mm and, preferably selected from the range of several hundreds of nm to several μm.

(Step 2)

Figure 4A:
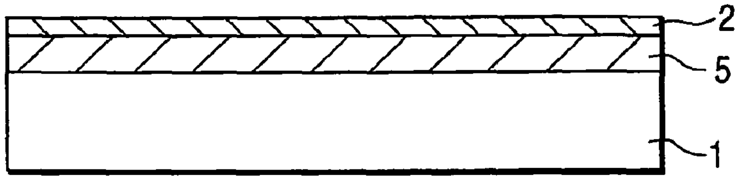
FIGS. 4A, 4B, 4C, and 4D are schematic views showing an example of a manufacturing method of the electron-emitting device in accordance with the present invention.

Subsequently, as shown in FIG. 4A, the layer 2 is deposited on the cathode electrode 5. The layer 2 is formed by a general vacuum deposition technique such as an evaporation method, a sputtering method, or a Hot Filament CVD (HFCVD) method but the invention is not limited to those methods. A thickness of the layer (electron-emitting film) 2 is set in the range of several nm to hundred nm, and preferably selected from the range of several nm to several tens of nm. In addition, this step may be carries out after step 6 to be described later (after forming an insulating layer 7 having an opening and the gate electrode 8 having an opening) to deposit the layer 2 selectively on the cathode electrode 5 exposed in an opening 9.

In the case of an rf sputtering method, for example, Ar is used as an atmosphere. However, for example, if $Ar/H_2$ is used, hydrogen can be taken into the layer 2. Parameters such as an rf power and a gas pressure may be decided appropriately.

Moreover, in the case in which cobalt is used as the main body of the particles 3 and carbon is used as the main body of the layer 2, for example, a method of using a multi-target which uses a graphite target and a cobalt target, a method of controlling a cobalt content using one target in which graphite and cobalt are mixed, or the like can be selected appropriately.

(Step 3)

Then, a step of performing heat treatment to cause the material of the particles 3 such as cobalt existing in the layer 2 to cohere (heat treatment to agglomerate the material of the particles) is performed, whereby the particles 3 are formed. However, the step of causing the material of the particles 3 to cohere may be performed later, and the material of the particles 3 is caused to cohere in a desired step. The heat treatment is performed, for example, at 450° C. or more by lamp-heating. The heat treatment is performed in an atmosphere containing hydrogen. However, it is preferable that the heat treatment is performed in an atmosphere containing hydrogen and hydrocarbon gas in terms of shortening the process. In addition, acetylene gas, ethylene gas, or the like is preferable as the hydrocarbon gas. In heat treatment in mixed gas of hydrogen and acetylene gas, a cohering reaction of metal (Co) can be facilitated at an increasing speed while keeping planarity of the surface of the layer 2. In heat treatment in an $N_2$ atmosphere, unevenness of the surface of the layer 2 increases.

(Step 4)

Subsequently, the insulating layer 7 is deposited. The insulating layer 7 is formed by the general vacuum deposition method such as the sputtering method, the CVD method, or the vacuum evaporation method, and a thickness thereof is set in the range of several nm to several μm, and preferably selected from the range of several tens nm to several hundreds nm. As a material for the insulating layer 7, a material with high withstanding pressure which can withstand a high electric field such as $SiO_2$, SiN, $Al_2O_3$, CaF, or undoped diamond is desirable.

(Step 5)

Figure 4B:
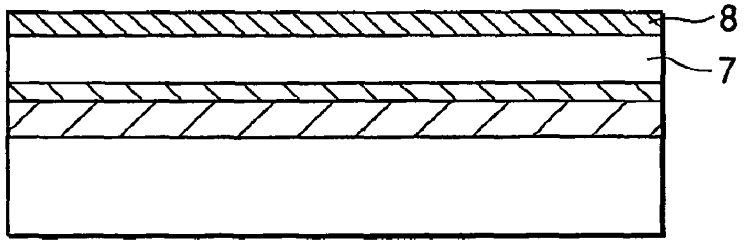

Moreover, the gate electrode 8 is deposited after the insulating layer 7 is deposited (FIG. 4B). The gate electrode 8 has electrical conductivity in the same manner as the gate electrode 5 and is formed by the general vacuum deposition technique such as the evaporation method or the sputtering method, or a photolithography technique. A material of the gate electrode 8 is appropriately selected from, for example, a metal or alloy material such as Be, Mg, Ti, Zr, Hf, V, Nb, Ta, Mo, W, Al, Cu, Ni, Cr, Au, Pt, or Pd, a carbide such as TiC, ZrC, HfC, TaC, SiC, or WC, a boride such as $HfB_2$, $ZrB_2$, $LaB_6$, $CeB_6$, $YB_4$, or $GdB_4$, a nitride such as TiN, ZrN, or HfN, or a semiconductor such as Si or Ge. A thickness of the gate electrode 8 is set in the range of several nm to several μm, and preferably selected from the range of several nm to several hundreds nm. Note that the electrodes 8 and 5 may be formed of an identical material or different materials and may be formed by an identical forming method or different forming methods.

(Step 6)

Figure 4C:
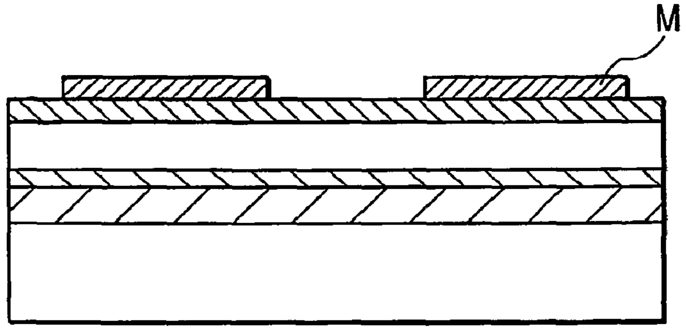
Figure 4D:
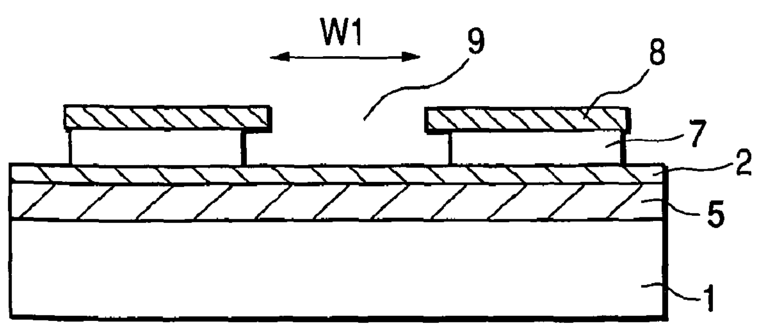

Next, as shown in FIG. 4C, a mask M of an opening pattern is formed by the photolithography technique and etching treatment is performed, whereby an electron-emitting device of a form shown in FIG. 4D can be formed. The gate electrode and the insulating layer 7 desirably have a smooth and vertical etching surface, and an etching method only has to be selected according to materials of the gate electrode and the insulating layer 7. The etching method may be dry or wet. Usually, a diameter W1 of the opening 9 is appropriately set according to a material forming a device or a resistance value of the device, a work function and a drive voltage of a material of an electron-emitting device, or a required shape of an electron emission beam. Usually, W1 is selected from the range of several hundreds nm to several tens μm.

Figure 24D:
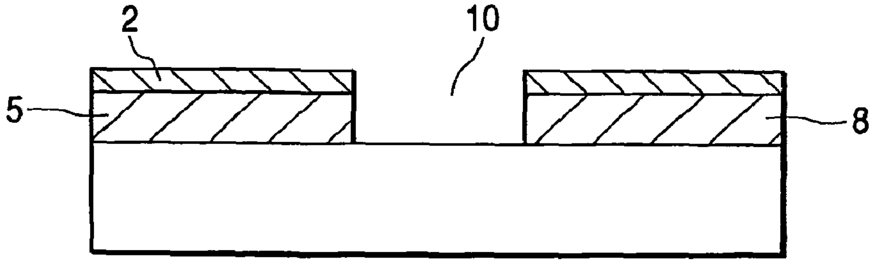
Figure 25:
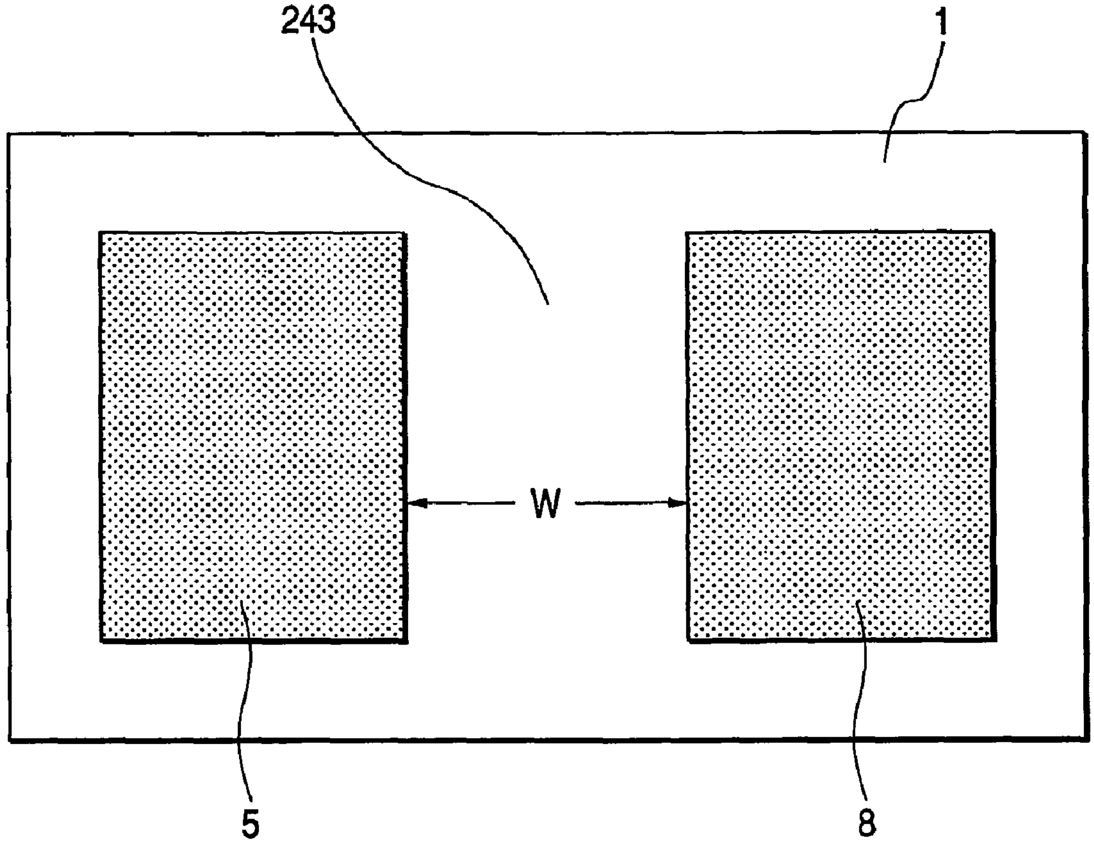
FIG. 25 is a schematic plan view showing an example of the electron-emitting device in accordance with the present invention.

Note that the electron-emitting device of the present invention is not limited to the form shown in FIGS. 4A to 4D, 16A, and 16B in which the electrode (gate electrode 8, etc.) for extracting electrons is arranged above the layer 2 arranged on the substrate. As shown in FIGS. 24D and 25, the electron-emitting device of the present invention may be in a form in which the layer 2 serving as an electron-emitting layer and the electrode (gate electrode 8) for extracting electrons from the layer 2 are arranged on the surface of the substrate 1 so as to be opposed to each other across a gap (space). FIG. 24D is a schematic sectional view and FIG. 25 is a schematic plan view. Even in the case of the electron-emitting device of the form shown in FIG. 24D, if an anode electrode is provided, a triode structure can be obtained by arranging the anode electrode above the substrate 1 as shown in FIG. 16A. Note that, although the form in which the layer 2 remains on the gate electrode 8 is illustrated in FIGS. 25 and 26, it is not always necessary that the layer 2 remain on the gate electrode 8.

In addition, preferably, in the electron-emitting device of the present invention, the surface of the layer 2 is terminated with hydrogen. By terminating the surface of the layer 2 with hydrogen, emission of electrons can be further facilitated.

Next, an example of application of the electron-emitting device to which the present invention is applied will be hereinafter described. A plurality of electron-emitting devices of the present invention are arranged on a substrate, whereby, for example, an electron source or an image display apparatus can be constituted.

Various arrangements of electron-emitting devices are adopted. As an example, there is a passive matrix arrangement in which a plurality of electron-emitting devices are arranged in a matrix shape in an X direction and a Y direction, one of electrodes of the plurality of electron-emitting devices arranged on the same row is commonly connected to wiring in the X direction and the other of electrodes of the plurality of electron-emitting devices arranged on the same column is commonly connected to wiring in the Y direction.

Figure 5:
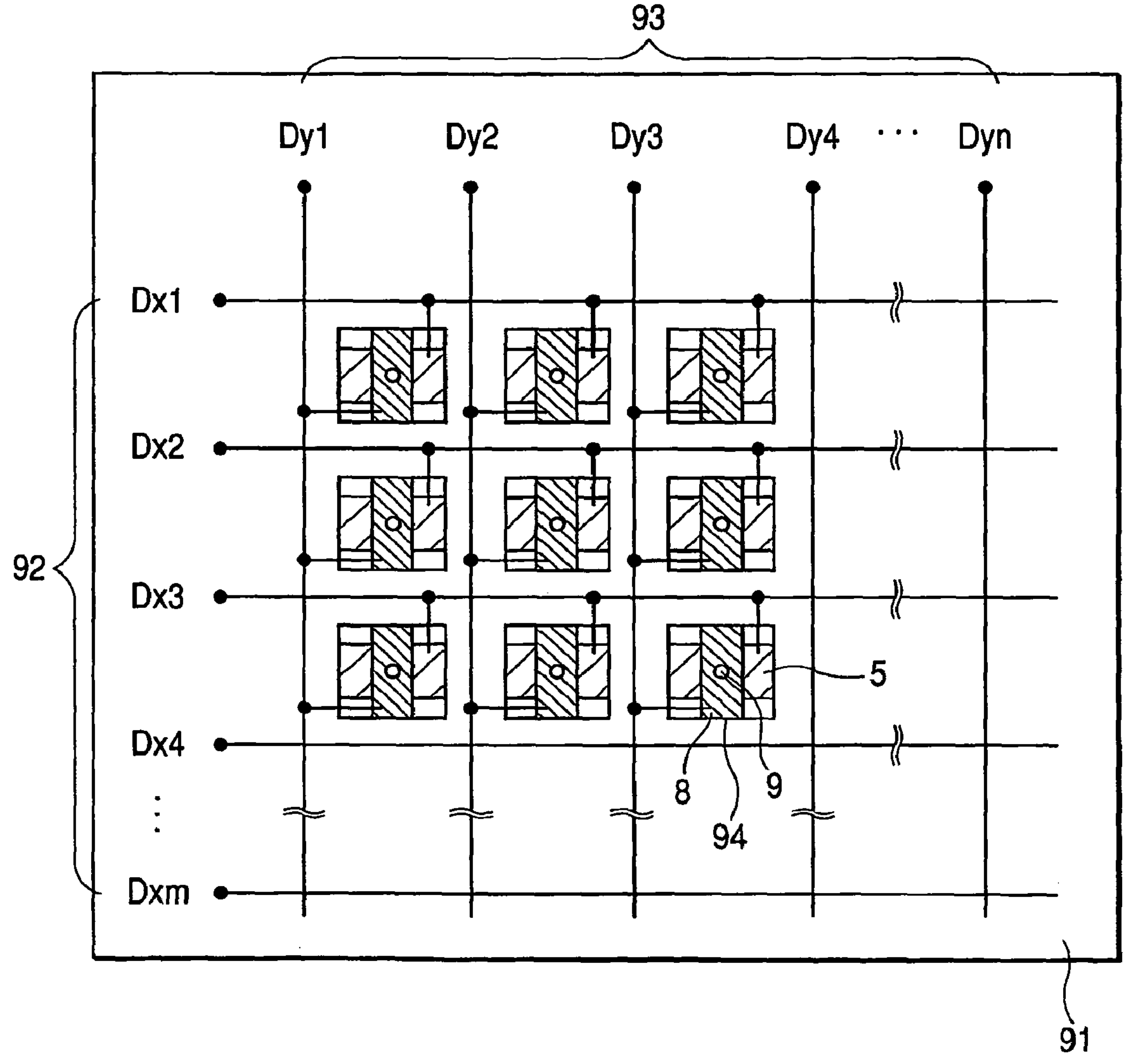
FIG. 5 is a structural diagram showing an electron source of a passive matrix arrangement in accordance with the present invention.

The electron source of the passive matrix arrangement obtained by arranging the plurality of electron-emitting devices, to which the present invention is applicable, will be hereinafter described using FIG. 5. In FIG. 5, reference numeral 91 denotes an electron source substrate; 92, X-direction wirings; and 93, Y-direction wirings. Reference numeral 94 denotes the electron-emitting device of the present invention.

The m X-direction wirings 92 consist of Dx1, Dx2, . . . Dxm and can be constituted by conductive metal or the like which is formed using the vacuum evaporation method, the print method, the sputtering method, or the like. A material, a film thickness, and a width of the wirings are appropriately designed. The Y-direction wirings 93 consist of n wirings of Dy1, Dy2, . . . Dyn and are formed in the same manner as the X-direction wirings 92. Not-shown interlayer insulating layers are provided among the m X-direction wirings 92 and the n Y-direction wirings 93 and separate both the wirings electrically (both m and n are positive integers).

The not-shown interlayer insulating layers are constituted by $SiO_2$ or the like which is formed using the vacuum evaporation method, the print method, the sputtering method, or the like. For example, the interlayer insulating layers are formed in a desired shape on the entire surface or a part of the surface of the substrate 91 on which the X-direction wirings 92 are formed. In particular, a film thickness, a material, and a manufacturing method thereof are set such that the interlayer insulating layer can withstand a potential difference at crossing parts of the X-direction wirings 92 and the Y-direction wirings 93. The X-direction wirings 92 and the Y-direction wirings 93 are drawn out as external terminals, respectively.

A pair of device electrodes (i.e., the above-mentioned electrodes 5 and 8) constituting the electron-emitting device 94 are connected electrically by the m X-direction wirings 92, the n Y-direction wirings 93, and connections consisting of conductive metal or the like.

A material constituting the X-direction wirings 92 and the Y-direction wirings 93, a material constituting the connection, and a material constituting the pair of device electrodes may be identical with each other or may be different from each other in a part or all of constituent elements thereof. These materials are appropriately selected, for example, according to the material of the above-mentioned device electrodes (electrodes 5 and 8). In the case in which the material constituting the device electrodes and the wiring material are identical, it can be said that the wirings connected to the device electrodes are device electrodes.

Not-shown scanning signal application means, which applies a scanning signal for selecting a row of the electron-emitting devices 94 arranged in the X direction, is connected to the X-direction wirings 92. On the other hand, not-shown modulation signal generation means for modulating each row of the electron-emitting devices 94 arranged in the Y direction according to an input signal is connected to the Y-direction wirings 93. A drive voltage applied to each electron-emitting device is supplied as a differential voltage of the scanning signal and the modulation signal applied to the device.

Figure 6:
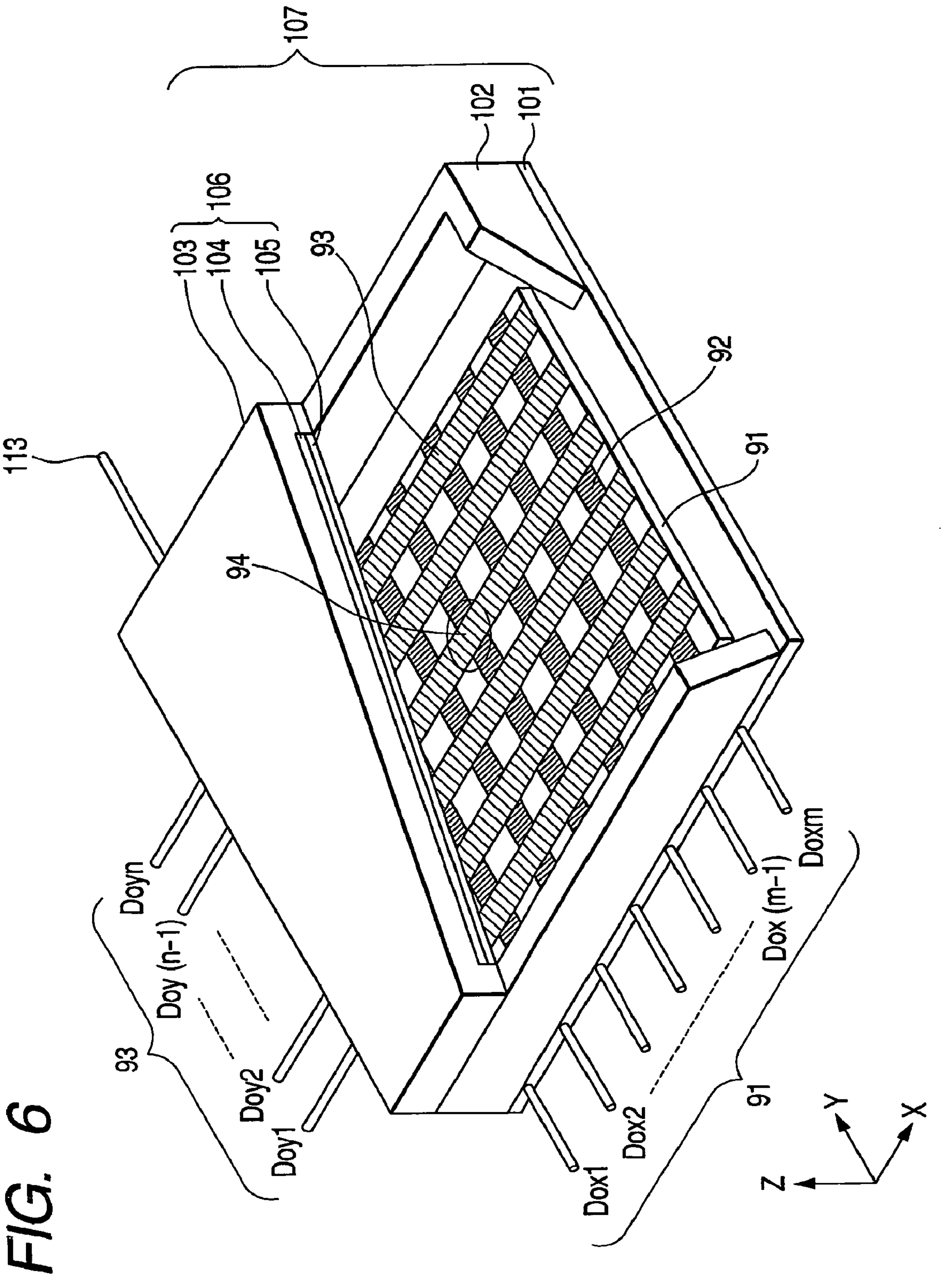
FIG. 6 is a schematic structural diagram showing an image display apparatus using the electron source of a passive matrix arrangement in accordance with the present invention.

In the above-mentioned constitution, an individual device can be selected and driven independently using the passive matrix wirings. An image display apparatus constituted by using an electron source of such a passive matrix arrangement will be described using FIG. 6. FIG. 6 is a schematic view showing an example of a display panel of the image display apparatus.

In FIG. 6, reference numeral 91 denotes an electron source substrate on which a plurality of electron-emitting devices are arranged; 101, a rear plate on which the electron source substrate 91 is fixed; and 106, a face plate in which a fluorescent film 104 serving as a phosphor, a metal back 105, and the like, which are image forming members, are formed inside a glass substrate 103. Reference numeral 102 denotes a support frame, and the rear plate 101 and the face plate 106 are connected to the support frame 102 using frit glasses or the like. Reference numeral 107 denotes an envelope, which is sealed and constituted by, for example, being baked for 10 minutes or more in the temperature range of 400 to 500° C. in the atmosphere or in nitrogen. Reference numeral 94 corresponds to the electron-emitting device in the present invention. Reference numerals 92 and 93 denote X-direction wirings and Y-direction wirings connected to the pair of electrodes 8 and 5 of the electron-emitting devices.

As described above, the envelope 107 is constituted by the face plate 106, the support frame 102, and the rear plate 101. Since the rear plate 101 is provided mainly for the purpose of increasing the strength of the substrate 91, the separately provided rear plate 101 can be made unnecessary if the substrate 91 itself has the sufficient strength. That is, the support frame 102 may be directly sealed to the substrate 91 to constitute the envelope 107 with the face plate 106, the support frame 102, and the substrate 91. On the other hand, the envelope 107 having the sufficient strength against the atmospheric pressure can also be constituted by setting a not-shown support body called a spacer between the face plate 106 and the rear plate 101.

Note that, in the image display apparatus using the electron-emitting device of the present invention, phosphors (fluorescent film 104) are arranged above the electron-emitting device 94 in alignment taking into account a trajectory of emitted electrons. In the present invention, since an electron beam reaches immediately above the electron-emitting device 94, the image display apparatus is constituted by positioning the fluorescent film 104 so as to be arranged immediately above the electron-emitting device 94.

Next, a vacuum sealing process for sealing an envelope (panel) subjected to the sealing process will be described.

The vacuum sealing process exhausts the envelope (panel) 107 through an exhaust pipe (not shown) with an exhaust apparatus such as an ion pump or an absorption pump to obtain an atmosphere with sufficiently little organic substance while heating the envelope (panel) 107 and keeping it at 80 to 250° C. and, then, heats the exhaust pipe with a burner to melt and seal it completely. In order to maintain a pressure after sealing of the envelope 107, getter processing can also be performed. This is processing for heating a getter, which is arranged in a predetermined position (not shown) in the envelope 107, with heating using resistance heating, high frequency heating, or the like to form an evaporation film immediately before performing the sealing of the envelope 107 or after the sealing. The getter usually contains Ba or the like as a main component thereof and maintains an atmosphere in the envelope 107 according to an absorption action of the evaporation film.

In the image display apparatus constituted by using the electron source of the passive matrix arrangement manufactured by the above-mentioned process, electron emission is caused by applying a voltage to the respective electron-emitting devices via terminals outside the case Dox1 to Doxm and Doy1 to Doyn. In addition, a high voltage Va is applied to the metal back 105 or a transparent electrode (not shown) via a high voltage terminal 113 to accelerate an electron beam. Accelerated electrons collide against the fluorescent film 104 and emits light, whereby an image is formed.

Figure 7:
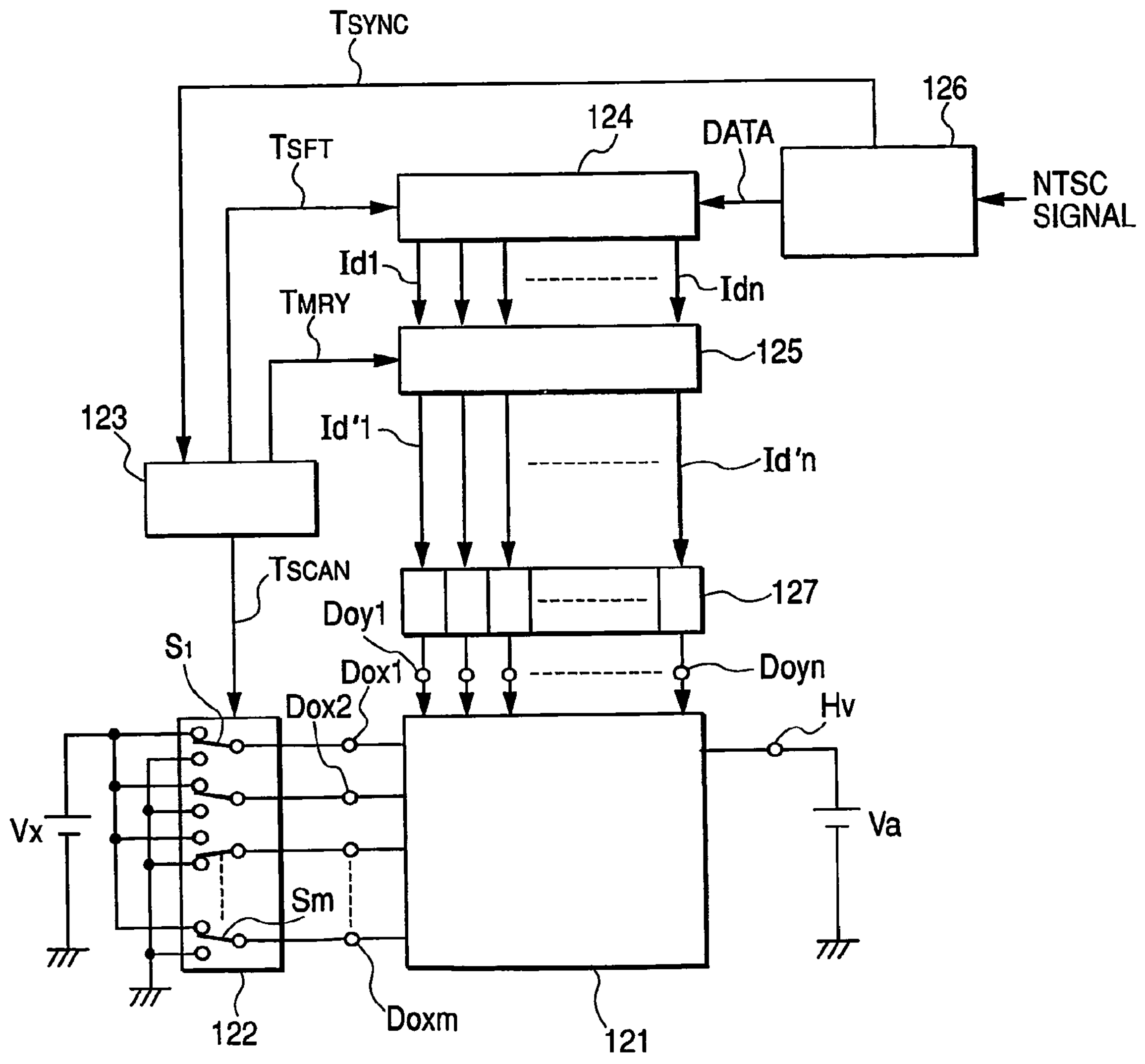
FIG. 7 is a drive circuit diagram of the image display apparatus using the electron source of a passive matrix arrangement in accordance with the present invention.

Next, an example of a structure of a drive circuit for performing television display, which is based upon a television signal of the NTSC system, on the display panel constituted by using the electron source of the passive matrix arrangement will be described using FIG. 7. In FIG. 7, reference numeral 121 denotes an image display panel; 122, a scanning circuit; 123, a control circuit; and 124, a shift register. Reference numeral 125 denotes a line memory; 126, a synchronizing signal separation circuit; and 127, a modulation signal generator; and reference symbols Vx and Va denote DC voltage sources.

The display panel 121 is connected to an outside electric circuit via the terminals Dox1 to Doxm, the terminals Doy1 to Doyn, and the high voltage terminal Hv. A scanning signal for sequentially driving the electron source provided in the display panel, that is, the group of electron-emitting devices wired in a matrix shape of M rows and N columns by one row (N devices) is applied to the terminals Dox1 to Doxm.

A modulation signal for controlling an output electron beam of each device of the electron-emitting devices of one row selected by the scanning signal is applied to the terminals Doy1 to Doyn. A DC voltage of, for example, 10 k[V] is supplied to the high voltage terminal Hv from the DC voltage source Va. This is an acceleration voltage for giving sufficient energy for exciting phosphors to an electron beam emitted from the electron-emitting device.

The scanning circuit 122 will be described. This circuit is provided with M switching elements in its inside (in the figure, the switching elements are schematically shown as S1 to Sm). The respective switching elements select one of an output voltage of the DC voltage source Vx and 0[V] (ground level) and are electrically connected to the terminals Dox1 to Doxm of the display panel 121. The respective switching elements of S1 to Sm operate based upon a control signal Tscan outputted by the control circuit 123 and can be constituted by combining a switching element such as an FET.

In the case of this example, the DC voltage source Vx is set so as to output a constant voltage for bringing a drive voltage to be applied to a device, which has not been scanned, to be equal to or lower than an electron emission threshold voltage based upon the characteristic (electron emission threshold voltage) of the electron-emitting device.

The control circuit 123 has a function of matching operations of respective parts such that appropriate display is performed based upon an image signal inputted from the outside. Based on a synchronizing signal Tsync sent from the synchronizing signal separation circuit 126, the control circuit 123 generates control signals of Tscan, Tsft, and Tmry for the respective parts.

The synchronizing signal separation circuit 126 is a circuit for separating a synchronizing signal component and a luminance signal component from a television signal of the NTSC system inputted from the outside and can be constituted by using a general frequency separation (filter) circuit or the like. Although the synchronizing signal separated by the synchronizing signal separation circuit 126 consists of a vertical synchronizing signal and a horizontal synchronizing signal, it is illustrated as the Tsync signal for convenience's sake of explanation here. The luminance signal component of the image separated from the television signal is represented as a DATA signal for convenience's sake. The DATA signal is inputted to the shift register 124.

The shift register 124 serial/parallel converts the DATA signal, which is inputted serially in time series, for every line of an image and operates based upon the control signal Tsft sent from the control circuit 123 (i.e., it can be said that the control signal Tsft is a shift clock of the shift register 124). Serial/parallel converted data for one line of an image (equivalent to drive data for N devices of the electron-emitting device) is outputted from the shift register 124 as N parallel signals of Id1 to Idn.

The line memory 125 is a storage device for storing the data for one line of an image only for a necessary time and stores contents of Id1 to Idn appropriately in accordance with the control signal Tmry sent from the control circuit 123. The stored contents are outputted as I'd1 to I'dn and inputted in the modulation signal generator 127.

The modulation signal generator 127 is a signal source for driving to modulate the respective electron-emitting devices appropriately according to the respective image data I'd1 to I'dn, and an output signal thereof is applied to the electron-emitting devices in the display panel 121 through the terminals Doy1 to Doyn.

The electron-emitting device of the present invention has the following basic characteristics with respect to an emission current Ie: Electron emission has a clear threshold voltage Vth, and the electron emission occurs only when a voltage equal to or higher than Vth is applied to the electron-emitting device. In response to the voltage equal to or higher than the electron emission threshold, an emission current changes according to a change in an applied voltage to the device. Consequently, in the case in which a voltage is applied to the device, for example, although the electron emission does not occur even if a voltage equal to or lower than the electron emission threshold is applied to the device, an electron beam is outputted in the case in which a voltage equal to or higher than the electron emission threshold is applied thereto. In that case, it is possible to control the intensity of the outputted electron beam by changing an applied voltage Vf. In addition, in the case in which a pulse voltage is applied to this device, it is possible to control the intensity of the electron beam by changing a height Ph of a pulse and control a total amount of charges of the outputted electron beam by changing a width Pw of the pulse.

Therefore, a voltage modulation system, a pulse width modulation system, or the like can be adopted as a system for modulating the electron-emitting device according to an input signal. In implementing the voltage modulation system, a circuit of the voltage modulation system, which generates a voltage pulse of a fixed length to modulate a peak value of the pulse appropriately according to data to be inputted, can be employed as the modulation signal generator 127.

In implementing the pulse width modulation system, a circuit of the pulse width modulation circuit, which generates a voltage pulse of a fixed peak value to modulate a width of the voltage pulse appropriately according to data to be inputted, can be employed as the modulation signal generator 127.

As the shift register 124 and the line memory 125, those of both a digital signal system and an analog signal system can be adopted. This is because serial/parallel conversion and storage of an image signal only have to be performed at a predetermined speed.

In the case in which the digital signal system is used, it is necessary to change the output signal DATA of the synchronizing signal separation circuit 126 into a digital signal. For this purpose, an A/D converter only has to be provided in an output section of the synchronizing signal separation circuit 126. In relation to this, a circuit used in the modulation signal generator 127 is slightly different depending upon whether the output signal of the line memory 125 is a digital signal or an analog signal. That is, in the case of the voltage modulation system using a digital signal, for example, an D/A conversion circuit is used for the modulation signal generator 127 and, if necessary, an amplification circuit or the like is added thereto. In the case of the pulse width modulation system, for example, a circuit, in which a high-speed oscillator, a counter for counting a wave number to be outputted by the high-speed oscillator, and a comparator for comparing an output value of the counter and an output value of the memory are combined, is used as the modulation signal generator 127. If necessary, an amplifier for modulating a modulation signal subjected to pulse width modulation to be outputted by the comparator to a drive voltage of the electron-emitting device can also be added.

In the case of the voltage modulation system using an analog signal, for example, an amplification circuit using an operational amplifier or the like can be adopted as the modulation signal generator 127 and, if necessary, a level shift circuit or the like can be added thereto. In the case of the pulse width modulation system, for example, a voltage control oscillation circuit (VCO) can be adopted and, if necessary, an amplifier for amplifying a modulation signal to a drive voltage of the electron-emitting device can be added thereto.

In the image display apparatus to which the present invention is applicable, which can take the structure as described above, a voltage is applied to the respective electron-emitting devices via the terminals outside the case Dox1 to Doxm and Doy1 to Doyn, whereby electron emission occurs. A high voltage is applied to the metal back 105 or a transparent electrode (not shown) via the high voltage terminal Hv to accelerate an electron beam. Accelerated electrons collide with a fluorescent film and light emission occurs, whereby an image is formed.

The structure of the image display apparatus described here is an example of the image display apparatus to which the present invention is applicable, and various modifications are possible based upon the technical idea of the present invention. As to an input signal, the NTSC system is described as an example. However, the input signal is not limited to this and, other than a PAL system and an SECAN system, a TV signal (e.g., high definition TV typified by an MUSE system or the like) system consisting of more scanning lines than those of the PAL and SECAM systems can be adopted.

The image display apparatus of the present invention can also be used as an image display apparatus or the like as an optical printer constituted by using a photosensitive drum or the like other than as a display apparatus for television broadcast and a display apparatus for a television conference system, a computer, or the like.

Embodiments

Embodiments of the present invention will be hereinafter described in detail.

First Embodiment

A manufacturing process of an electron-emitting device manufactured according to this embodiment will be described in detail using FIGS. 8A(a) to 8A(c).

Figure 8A:
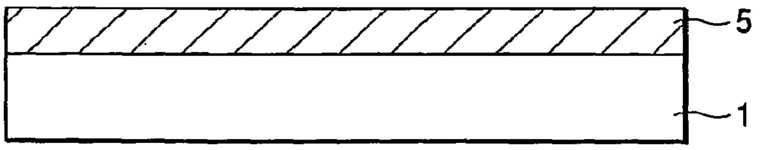
FIGS. 8A(a), 8A(b), and 8A(c) are schematic views showing an electron-emitting device in accordance with a first embodiment of the present invention.
Figure 8A:
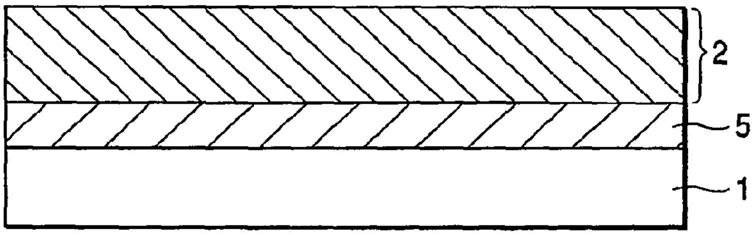
Figure 8A:
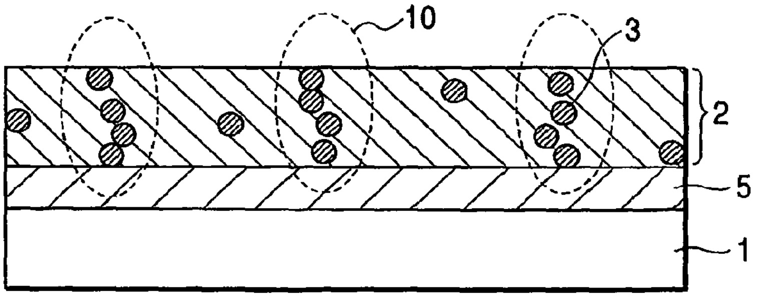

First, quartz was used as a substrate 1 and, after sufficiently cleaning the substrate, a film of Ta with a thickness of 500 nm was formed as a cathode electrode 5 by the sputtering method (FIG. 8A(a)).

Subsequently, a carbon film 2 with a nickel concentration of 0.02% was deposited to have a thickness of about 12 nm on the cathode electrode 5 by the sputtering method (FIG. 8A(b)). Ar was used as an atmospheric gas. Conditions are as described below:

rf power supply: 13.56 MHz
rf power: 400 W
Gas pressure: 267 mPa
Substrate temperature: 300° C.
Target: Mixed target of graphite and nickel Next, the substrate was subjected to heat treatment by lamp heating at 600° C. for 300 minutes in hydrogen containing atmosphere. Then, as shown in FIG. 8A(c), nickel cohered and a plurality of particles 3 which mainly includes nickel were formed. As shown in FIG. 8A(c), aggregates (groups of particles) 10 of metal particles 3 exist a film thickness of the carbon film 2 or more apart from each other. A concentration P of nickel particles 3 formed by the heat treatment was $P=1\times10^{16}/cm^3$ according to TEM observation.

Figure 9:
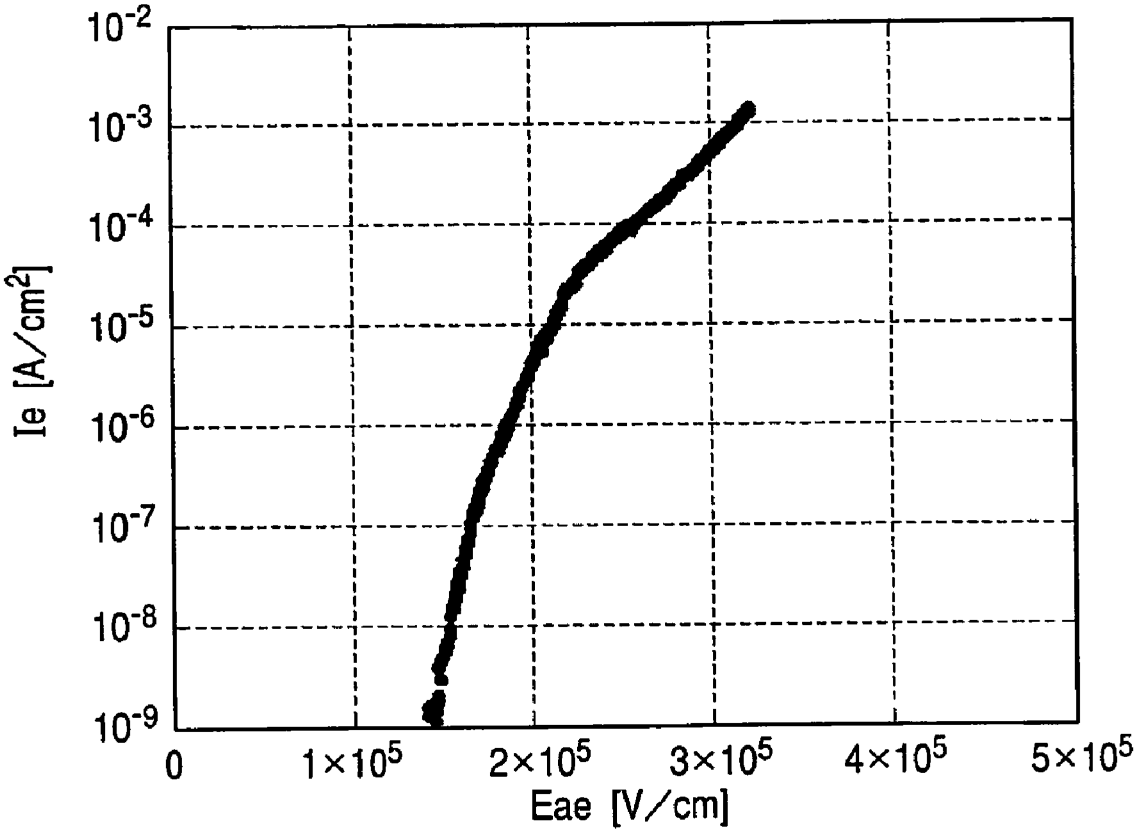
FIG. 9 is a graph showing a volt-ampere characteristic of the electron-emitting device in accordance with the present invention.

An electron-emitting characteristic of the electron-emitting device comprising the layer 2 and the cathode electrode 5 manufactured in this embodiment was measured. With the electron-emitting device manufactured in this embodiment as a cathode, a voltage was applied to an anode (with an area of 1 $mm^2$), which is parallel with the layer (electron-emitting film) 2, 1 mm apart from the layer 2. A voltage/current characteristic of the electron-emitting device is shown in FIG. 9. Note that the horizontal axis indicates an electric field intensity and the vertical axis indicates an emission current density.

In the electron-emitting device manufactured in this embodiment, there was no remarkable electrical breakdown, that is, a satisfactory electron-emitting characteristic without conditioning could be observed.

Second Embodiment

A manufacturing process of an electron-emitting device manufactured according to this embodiment will be described in detail using FIGS. 8B(a) to 8B(c).

Figure 8B:
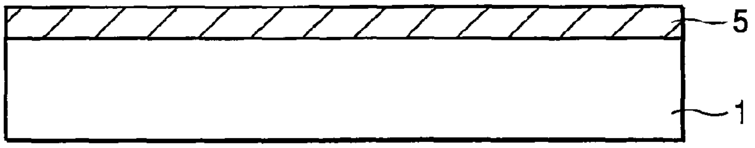
FIGS. 8B(a), 8B(b), and 8B(c) are schematic views showing an electron-emitting device in accordance with a second embodiment of the present invention.
Figure 8B:
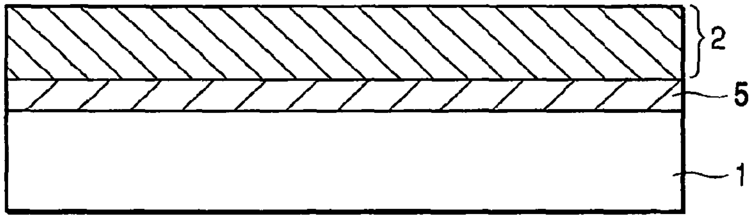
Figure 8B:
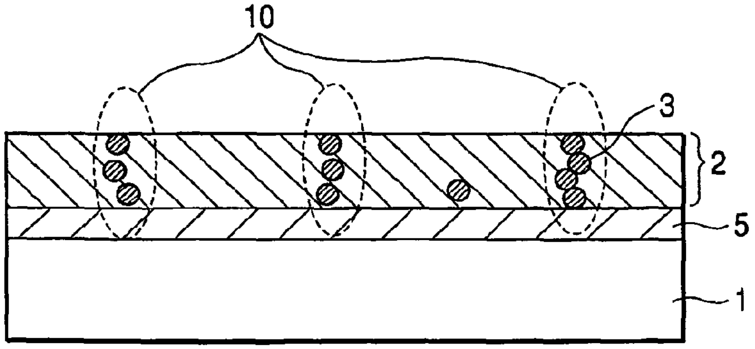

First, quartz was used as a substrate 1 and, after sufficiently cleaning the substrate, a film of Ta with a thickness of 500 nm was formed as a cathode electrode 5 by the sputtering method (FIG. 8B(a)).

Subsequently, a carbon film 2 with a cobalt concentration of 0.3% and a hydrogen concentration of 1% was deposited to have a thickness of about 12 nm on the cathode electrode 5 by the sputtering method (FIG. 8B(b)). A mixed gas of Ar and $H_2$ with a mixture ratio of 1:1 was used as an atmospheric gas.

Conditions are as described below:
rf power supply: 13.56 MHz
graphite rf power: 1 KW
cobalt rf power: 10 W
Gas pressure: 267 mPa
Substrate temperature: 300° C.
Target: Mixed target of graphite and cobalt Next, the substrate was subjected to heat treatment by lamp heating at 600° C. for 60 minutes in a mixed gas atmosphere of acetylene and hydrogen. Reaction was faster than with the hydrogen atmosphere described in the first embodiment, and cobalt cohered and cobalt particles 3 of a crystal structure were formed (FIG. 8B(c)). At this point, in parts other than the cohered cobalt particles 3, cobalt was equal to or less than a detection limit in EDAX measurement. A concentration of cobalt particles formed by the heat treatment was $P=1\times10^{17}/cm^3$ according to the TEM observation.

An electron-emitting characteristic of the electro-emitting device manufactured in this embodiment can be measured as well as embodiment 1. With the electron-emitting device manufactured in this embodiment as a cathode, a voltage was applied to an anode, which is parallel with the electron-emitting film, 1 mm apart from the electron-emitting device. As a result, there was no remarkable electrical breakdown, that is, a satisfactory electron-emitting characteristic without conditioning could be observed. Moreover, an electron-emitting film with smaller hardness and less stress compared with the first embodiment could be formed.

Third Embodiment

A manufacturing process of an electron-emitting device manufactured according to this embodiment will be described in detail using FIGS. 10A to 10C.

Figure 10A:
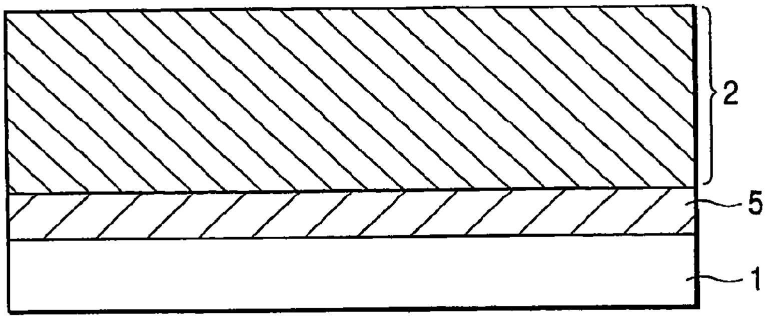
FIGS. 10A, 10B, and 10C are schematic views showing an electron-emitting device in accordance with a third embodiment of the present invention.

First, as shown in FIG. 10A, an $n^+$Si substrate was used as a substrate 1 and a film of Ta with a thickness of 500 nm was formed as a cathode electrode 5. Subsequently, a carbon film 2 was deposited to have a thickness of about 30 nm by the HFCVD method. An apparatus diagram of the HFCVD method is shown in FIG. 11.

Figure 11:
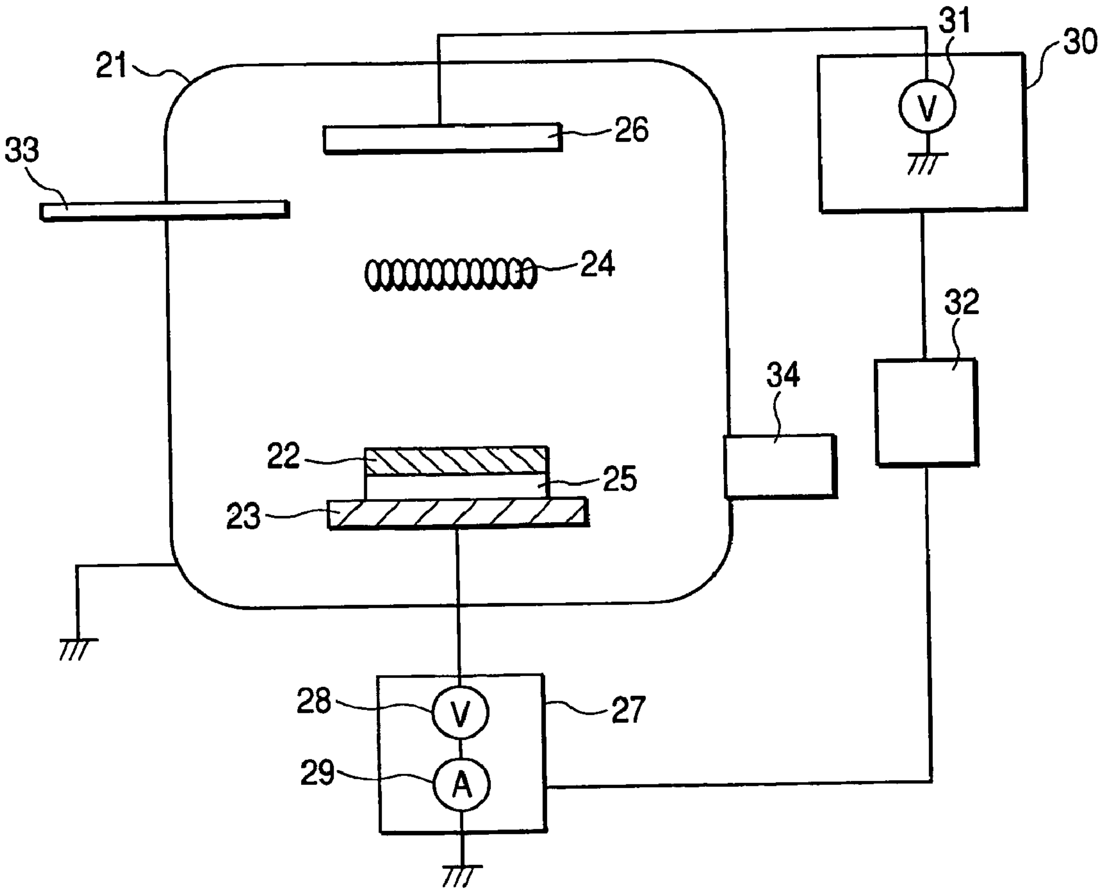
FIG. 11 is an apparatus diagram in accordance with a third embodiment of the present invention.

In FIG. 11, reference numeral 21 denotes a vacuum container; 22, a substrate; 23, a substrate holder; 24, a heat source for dissolving thermoelectron and material gas to generate ions; 25, a substrate bias electrode for applying a voltage to the substrate; 26, an electrode for extracting thermoelectron from the heat source 24; 27, a monitoring mechanism for observing a substrate voltage and a current flowing to the substrate; 28, a power supply for applying a voltage to the substrate; 29, a current monitoring mechanism for monitoring a substrate current; 30, a voltage application mechanism for applying a voltage to a thermoelectron extraction electrode; 31, a power supply for applying a voltage to the thermoelectron extracting electrode; 32, a film formation process control mechanism for controlling the mechanisms 27 and 30; 33, a gas introducing port; and 34, an exhaust pump for exhaust the vacuum container 21.

Note that the substrate holder 23 and the substrate bias electrode 25 may be insulated by a ceramic plate or the like. In addition, a voltage is inputted to the heat source 24 by a not-shown power supply, and the heat source 24 is heated to a desired temperature. The power supply at this point may be direct current or alternating current. Moreover, the film formation process control mechanism 32 may be controlled by a personal computer or the like or may have a structure which can be controlled manually.

In an HFCVD apparatus shown in FIG. 11, an $n^+$Si substrate was arranged on the substrate bias electrode 25 and the vacuum container 21 was exhausted to $1\times10^{-5}$ Pa using the exhaust pump 34. Next, hydrogen gas of 10 sccm was introduced from the gas introducing port 33 and the vacuum container 21 was held at $1\times10^{-1}$ Pa. Thereafter, after applying an AC voltage of 14 V to the heat source 24 to heat it to 2100° C., a DC voltage of 150 V was applied to the substrate bias electrode 25 using the voltage application mechanism 27, and a current value of 0.5 mA was observed by the current monitor 29. This state was held for 20 minutes and substrate cleaning was performed.

Next, the introduction of hydrogen gas was stopped and, after exhausting the vacuum container 21 to $1\times10^{-5}$ Pa again, the vacuum container 21 was held at $1\times10^{-1}$ Pa. Next, after setting the substrate 22 to 30° C. using a substrate heating mechanism, a DC voltage of −150 V was applied to the substrate bias electrode 25. Next, an AC voltage of 15 V was applied to the heat source 24 to heat it to 2100° C. Next, a voltage was applied to the thermoelectron extracting electrode 26 and ions were irradiated on the substrate 22. At this point, a voltage value of the thermoelectron extracting electrode 26 was set to 90 V such that a current amount observed by the current monitoring mechanism 29 becomes 5 mA, and the substrate 22 was held in this state for 10 minutes to form a DLC film 2 with many $SP^3$ bondings.

Figure 10B:
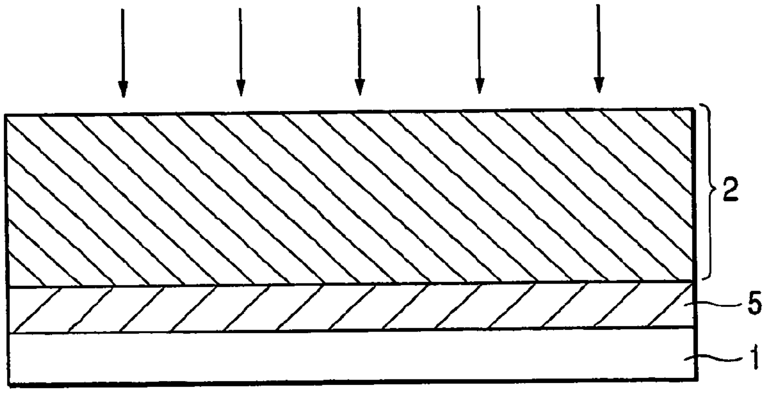
Figure 10C:
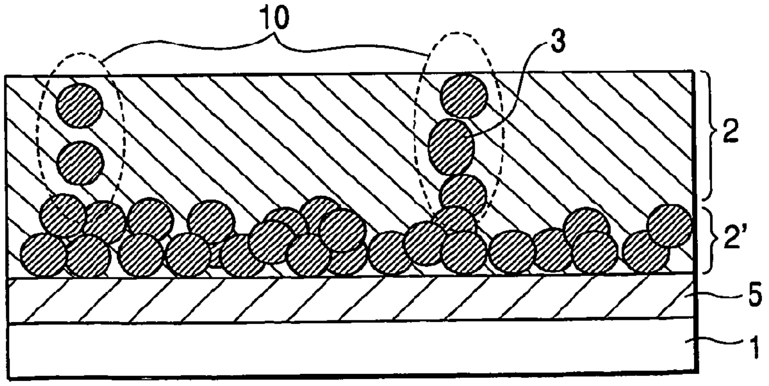

Subsequently, cobalt was injected into the DLC (diamond-like-carbon) film by the ion implantation method at 25 keV and with a dose amount of $3\times10^{16}/cm^2$ (FIG. 10B).

Next, the substrate was subjected to heat treatment by lamp heating at 550° C. for 300 minutes in an acetylene 0.1% atmosphere (99.9% hydrogen). Then, as shown in FIG. 10C, cobalt cohered and cobalt particles 3 of a crystal structure were partially formed on a surface layer (layer 2). In addition, aggregates (groups of particles) 10 of the cobalt particles 3 were formed discretely in the layer 2. At this point, in the carbon film in parts other than the cohered cobalt particles, cobalt was equal to or less than a detection limit in EDAX measurement. On the other hand, in parts (layer 2') close to an interface between the DLC film and the Si substrate, a density of the cobalt particles was high and most of them function as a conductor(conductive layer). In a sectional TEM image, it was seen that the cobalt particles 3 existed in a monocrystal state in the DLC film 2. When the image was further enlarged, it was observed that a graphite layer grew around the Co particles. A concentration of the cobalt particles formed by the heat treatment was $P=5\times10^{16}/cm^3$ according to the TEM observation. A hydrogen concentration was 4%.

In addition, when unevenness of the surface of the layer 2 was evaluated with an AFM, it was found that planarity was secured at values of 4.4 nm as a P-V (peak to valley) value (maximum value−minimum value) and 0.28 nm as rms.

Figure 12:
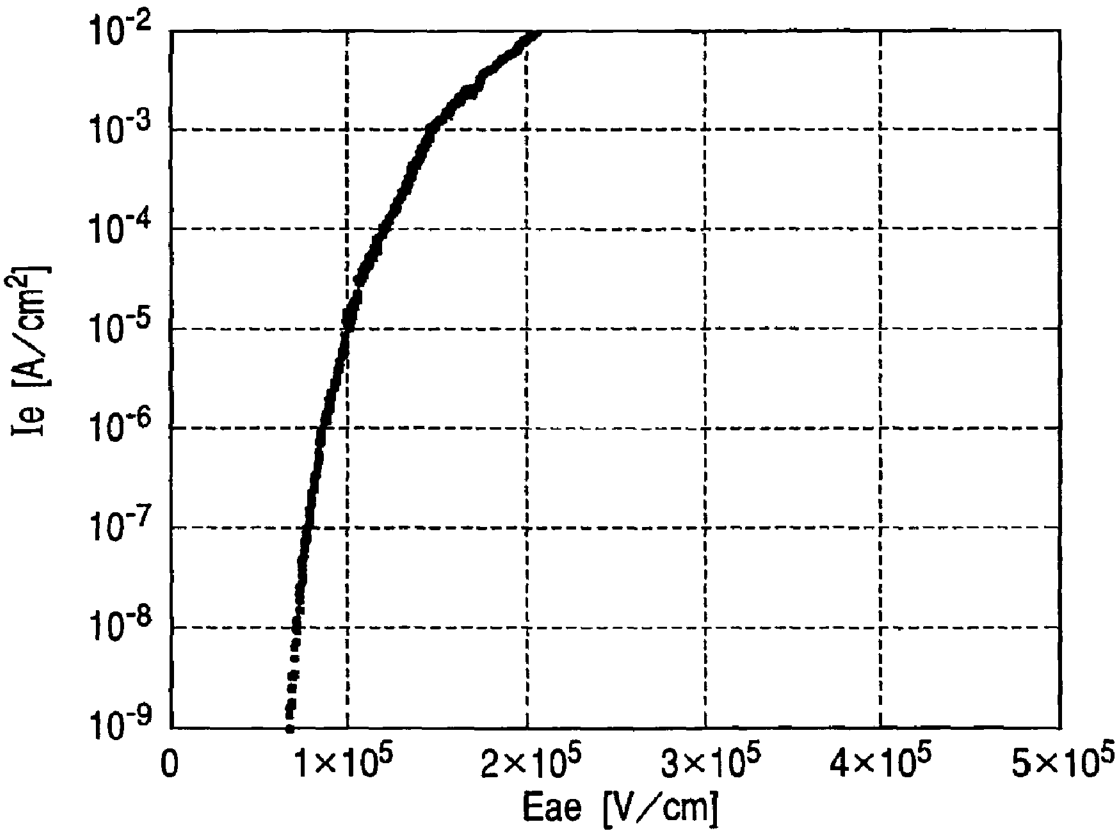
FIG. 12 is a graph showing a volt-ampere characteristic of the electron-emitting device in accordance with the present invention.

An electron-emitting characteristic of the electron-emitting device thus manufactured was measured. With the electron-emitting device manufactured in this embodiment as a cathode, a voltage was applied to an anode (with an area of 1 $mm^2$), which is parallel with the electron-emitting device, 1 mm apart from the electron-emitting device. A volt-ampere characteristic at this point is shown in FIG. 12. Note that the horizontal axis indicates an electric field intensity and the vertical axis indicates an emission current density.

In the electron-emitting device manufactured in this embodiment, there was no remarkable breakdown, that is, a satisfactory electron-emitting characteristic without conditioning could be observed. An electron emission site density (ESD) was $1\times10^{6}/cm^2$ or more, and an emission current density was as large as 10 $mA/cm^2$ or more.

Fourth Embodiment

Figure 13A:
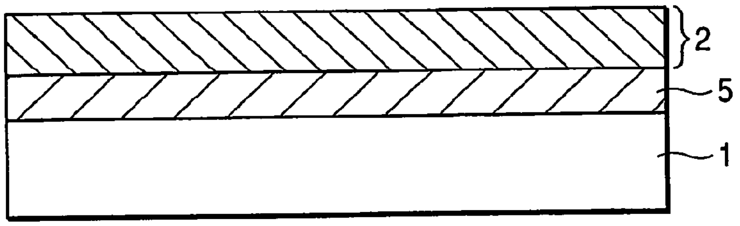
FIGS. 13A, 13B, and 13C are schematic views showing an electron-emitting device in accordance with a fourth embodiment of the present invention.

A manufacturing process of an electron-emitting device manufactured according to this embodiment will be described in detail using FIGS. 13A to 13C.

An $n^+$Si substrate was used as a substrate 1 and a film of Ta with a thickness of 500 nm was formed as a cathode electrode 5 by the sputtering method. Subsequently, a DLC film 2 was deposited to have a thickness of about 15 nm by the HFCVD method (similarly to the third embodiment). The film thickness was adjusted by shortening the time.

Figure 13B:
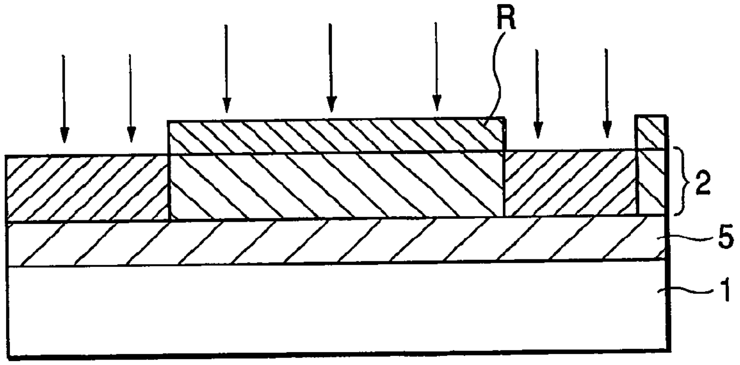
Figure 13C:
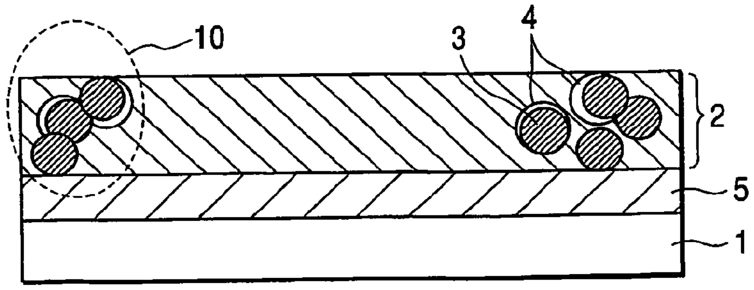

Subsequently, the DLC film 2 was subjected to resist application and patterning and, thereafter, cobalt was injected by the ion implantation method in the DLC film 2 at 25 keV and with a dose amount of $5\times10^{16}/cm^2$ (FIG. 13B). Cobalt was partially injected only in areas where resist R was not arranged. RP was in the silicon substrate, and only a low concentration layer of cobalt of the third embodiment was formed in a carbon film. Since the DLC film was subjected to patterning and ion implantation, places where particles containing metal are formed are determined, and areas arranged from a cathode electrode side to the surface of the DLC film 2 (aggregates 10 of particles) are never formed adjacent to each other in the DLC film 2 but are discretely arranged in a plural form even if an ion implantation concentration is high.

Next, the substrate was subjected to heat treatment by lamp heating at 750° C. for 60 minutes in an acetylene 0.1% atmosphere (99.9% hydrogen). Then, as shown in FIG. 13C, cobalt cohered and cobalt particles 3 of a crystal structure were formed in high concentration. When the image was further enlarged, it was observed that a microstructure of graphite (graphenes) 4 was formed around Co particles.

An electron-emitting characteristic of the electro-emitting device thus manufactured was measured. With the electron-emitting device manufactured in this embodiment as a cathode, a voltage was applied to an anode, which is parallel with the electron-emitting device, 1 mm apart from the electron-emitting device. As a result, there was no remarkable breakdown, that is, a satisfactory electron-emitting characteristic without conditioning could be observed.

Fifth Embodiment

A manufacturing process of an electron-emitting device manufactured according to this embodiment will be described in detail using FIGS. 14A, 14B, and 14C.

An $n^+$Si substrate was used as a substrate 1 and a film of Ta with a thickness of 500 nm was formed as a cathode electrode 5 by the sputtering method.

Figure 14A:
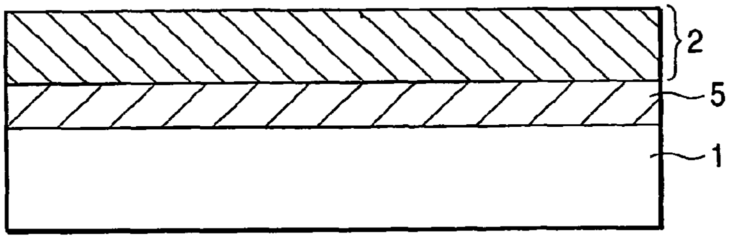
FIGS. 14A, 14B, and 14C are schematic views showing an electron-emitting device in accordance with a fifth embodiment of the present invention.
Figure 14B:
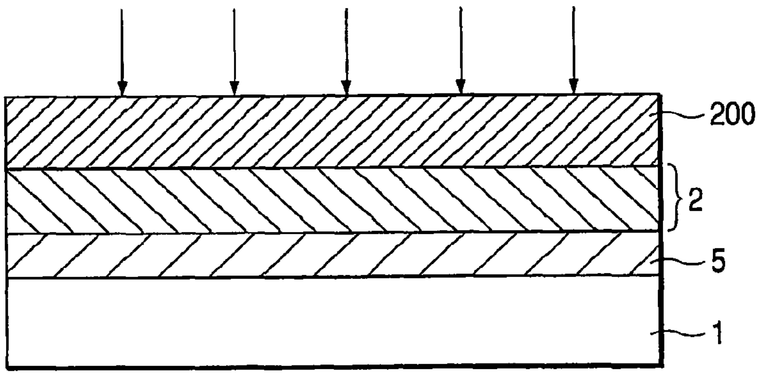
Figure 14C:
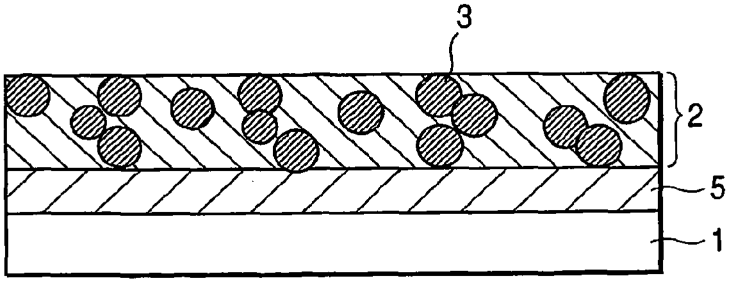

Subsequently, a DLC film 2 was deposited to have a thickness of about 15 nm by the HFCVD method similarly to the third embodiment (FIG. 14A).

Subsequently, a silicon oxide film 200 was formed to have a thickness of 25 nm by the sputtering method. Thereafter, cobalt was injected in the silicon oxide film and the DLC film by the ion implantation method at 25 keV and with a dose amount of $5\times10^{15}/cm^2$ (FIG. 14B). RP is in the silicon oxide film and concentration is as high as 1% on the surface of the DLC.

After removing the silicon oxide film with buffered hydrofluoric acid, the substrate was subjected to heat treatment by lamp heating at 550° C. for 300 minutes in an acetylene 0.1% atmosphere (99.9% hydrogen). Then, as shown in FIG. 14C, cobalt cohered and cobalt particles 3 of a crystal structure were formed in high concentration with $2\times10^{17}/cm^3$ on the surface thereof.

An electron-emitting characteristic of the electro-emitting device thus manufactured was measured. With the film manufactured in this embodiment as a cathode, a voltage was applied to an anode, which is parallel with the electron-emitting film, 1 mm apart from the electron-emitting device. As a result, there was no remarkable breakdown, that is, a satisfactory electron-emitting characteristic without conditioning could be observed. Although a threshold value for electron emission was high but there were many emission sites compared with the third embodiment, and an ESD was $1\times10^{7}/cm^2$ or more and a current density of 10 $mA/cm^2$ or more was obtained.

Sixth Embodiment

Figure 15:
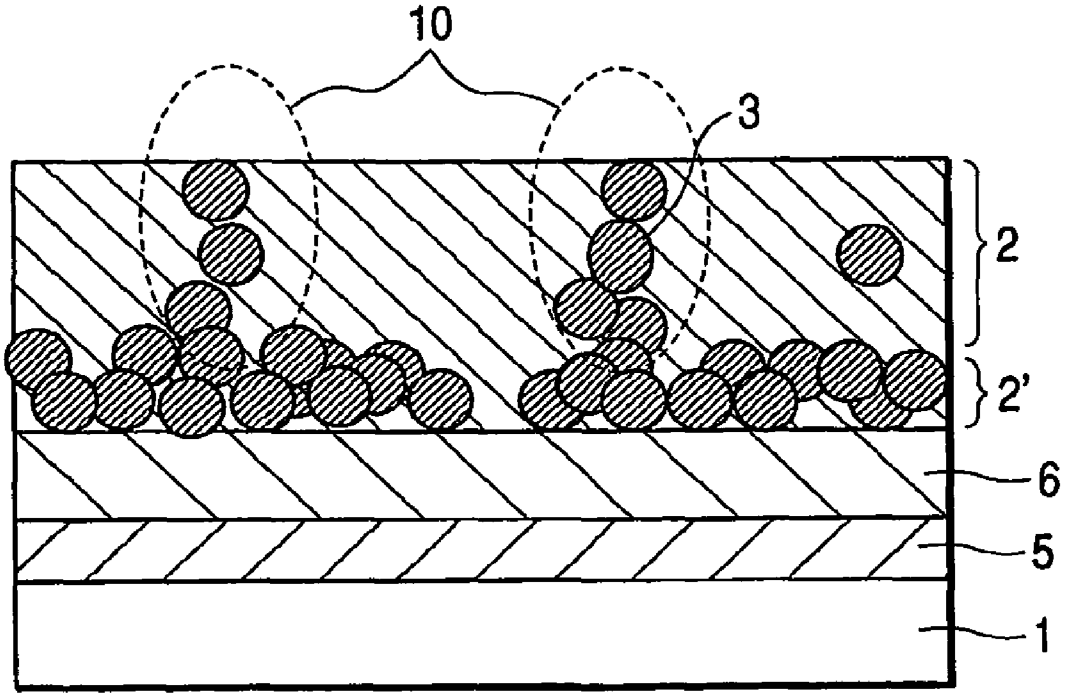
FIG. 15 is a schematic view showing an electron-emitting device in accordance with a sixth embodiment of the present invention.

A manufacturing process of an electron-emitting device manufactured according to this embodiment will be described in detail using FIG. 15.

First, quartz was used as a substrate 1 and, after sufficiently cleaning the substrate 1, a film of Ta with a thickness of 500 nm was formed as a cathode electrode 5 by the sputtering method.

Subsequently, a carbon film 6 was deposited to have a thickness of about 12 nm on the cathode electrode 5 by the sputtering method. $Ar/H_2$ was used as an atmospheric gas. Conditions are as described below:

rf power supply: 13.56 MHz
rf power: 400 W
Gas pressure: 267 mPa
Substrate temperature: 300° C.
Target: Graphite Subsequently, a carbon film of cobalt concentration of 8% was deposited to have a thickness of about 12 nm on the carbon film 6 with a multi-target of cobalt and graphite as a target. As an atmospheric gas, $Ar/H_2$ was used.

Conditions are as shown below:
rf power supply: 13.56 MHz
Graphite rf power: 600 W
Cobalt rf power: 10 W
Gas pressure: 267 mP·BR>Substrate temperature: 300° C.
Target: Graphite and cobalt Note that, in this process, a power on the graphite target side was increased and a cobalt ratio was gradually reduced. On the surface of the substrate, a Co concentration was set to 0.1%.

Next, the substrate was subjected to heat treatment at 600° C. for 300 minutes in an acetylene 0.1% atmosphere (99.9% hydrogen). Then, as shown in FIG. 15, cobalt cohered and cobalt particles 3 of a crystal structure were formed. A laminated structure was formed in which a Ta electrode 5, a high resistance layer 6 composed of amorphous carbon, a low resistance Co—C layer 2' with Co particles 3 arranged in a high concentration, and a layer 2 with Co particles 3 arranged in a low concentration were laminated in this order. In the layer 2, areas (aggregates of particles) 10 in which the cobalt particles 3 were arranged from the cathode electrode 5 side toward the surface of the layer 2 were discretely formed. In such a structure, the high resistance layer 6 of the bottom layer functions as a current restriction resistance preventing electrons from being emitted excessively at the time of electron emission and contributes to uniform electron emission. In the low resistance layer 2' in the middle, a density of cobalt particles is high, and electrons passed through the high resistance layer 6 enters the cobalt particles and conducts upward with an electric field. This low resistance layer 2' acts as a conductor rather than a dielectric body. In the vicinity of the surface of the substrate, a density of cobalt particles is low, there is obtained a structure in which electric field concentration is likely to occur, and electrons are emitted into vacuum.

An electron-emitting characteristic of the electro-emitting device thus manufactured was measured. With the electron-emitting device manufactured in this embodiment as a cathode, a voltage was applied to an anode, which is parallel with the electron-emitting device, 1 mm apart from the electron-emitting device. As a result, there was no remarkable breakdown, that is, a satisfactory electron-emitting characteristic without conditioning and which shows a uniform light emitting characteristic could be observed.

Seventh Embodiment

A schematic sectional view of an electron-emitting device manufactured according to this embodiment is shown in FIG. 16A, and a schematic plan view thereof is shown in FIG. 16B.

Reference numeral 1 denotes a substrate; 5, a cathode electrode; 7, an insulating layer; 8, a gate electrode; and 2, an electron-emitting film. In addition, reference symbol W1 denotes a diameter of a hole provided in the gate electrode 8.

Reference symbol Vg denotes a voltage applied between the gate electrode 8 and the cathode electrode 5; Va, a voltage applied between the gate electrode 8 and the anode 12; and Ie, an electron emission current.

When Vg and Va are applied in order to drive the device, a strong electric field is formed in the hole, and a shape of an equipotential surface inside the hole is determined according to Vg, a thickness and a shape of the insulating layer 7, or a dielectric constant or the like of the insulting layer. Outside the hole, a substantially parallel equipotential surface is obtained due to Va, although mainly depending upon a distance H between the cathode electrode 5 and the anode 12.

When an electric field applied to the electron-emitting film 2 exceeds a certain threshold value, electrons are emitted from the electron-emitting film. Electrons emitted from the hole are accelerated toward the anode 12 this time and collide against phosphors (not shown) provided in the anode 12 to emit light.

A manufacturing process of the electron-emitting device of this embodiment will be hereinafter described in detail using FIGS. 4A to 4D.

(Step 1)

First, as shown in FIG. 4A, quartz was used as the substrate 1 and, after sufficiently cleaning the substrate 1, a film of Ta with a thickness of 500 nm was formed as the cathode electrode 5 by the sputtering method.

(Step 2)

Subsequently, the carbon film 2 was deposited to have a thickness of 30 nm by the HFCVD method. At this point, the carbon film 2 was formed with conditions under which DLC grows. Growing conditions are shown below:
Gas: $CH_4$
Substrate bias: −50 V
Gas pressure: 267 mPa
Substrate temperature: Room temperature
Filament: Tungsten
Filament temperature: 2100° C.
Back bias: 100 V (Step 3)

Subsequently, cobalt was injected into the DLC film 2 by the ion implantation method at 25 keV and with a dose amount of $3\times10^{16}/cm^2$.

(Step 4)

Next, the substrate was subjected to heat treatment by lamp heating at 550° C. for 60 minutes in an acetylene 0.1% atmosphere (99.9% hydrogen).

(Step 5)

Next, as shown in FIG. 4B, $SiO_2$ with a thickness of 1 μm and Ta with a thickness of 100 nm were deposited as the insulating layer 7 and the gate electrode 8, respectively, in this order.

(Step 6)

Next, as shown in FIG. 4C, spin coating and a photo mask pattern of a positive photoresist (AZ1500/manufactured by Clariant Corporation) was exposed and developed by photolithography to form a mask pattern.

(Step 7)

As shown in FIG. 4D, the gate electrode 8 of Ta was dry-etched using $CF_4$ gas with the mask pattern as a mask and, subsequently, the $SiO_2$ film 7 was etched by buffered hydrofluoric acid to form the opening 9.

(Step 8)

The mask pattern was completely removed to complete the electron-emitting device of this embodiment. Note that a film stress was little and film peeling or other problems in process did not occur.

Figure 17:
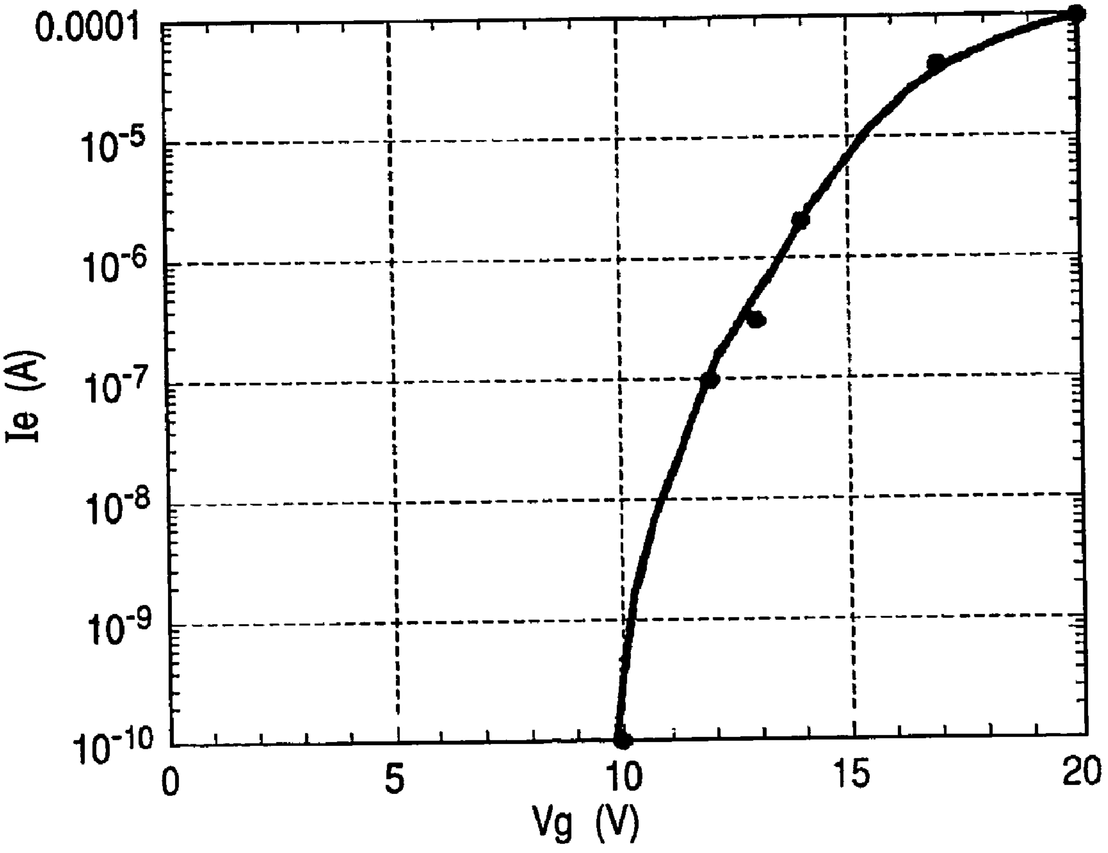
FIG. 17 is a graph showing a volt-ampere characteristic of the electron-emitting device in accordance with the present invention.
Figure 18:
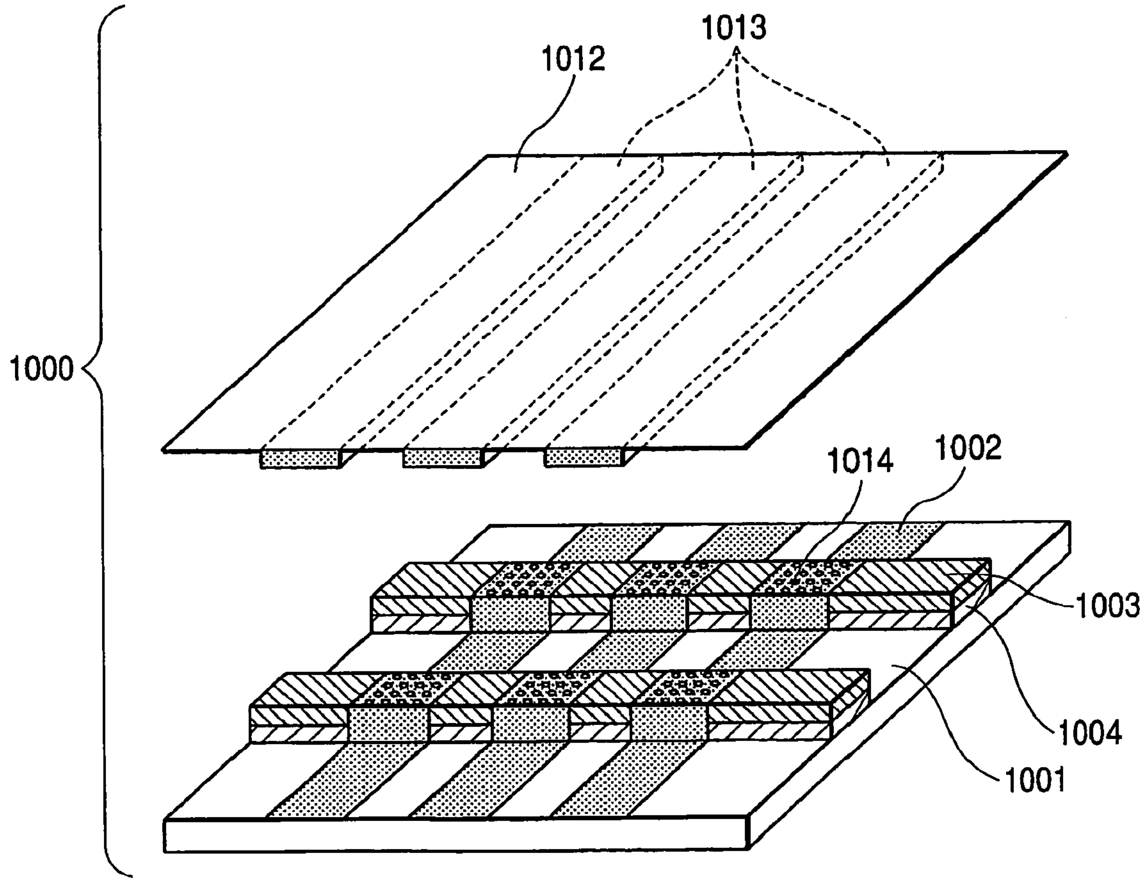
FIG. 18 is a view schematically showing an example of an image display apparatus employing a triode structure using a conventional electron-emitting device.

As shown in FIGS. 16A and 16B, the anode electrode 12 was arranged above the electron-emitting device manufactured as described above, and a voltage is applied between the electrodes 5 and 8 to drive the device. FIG. 17 is a graph of a volt-ampere characteristic of the electron-emitting device manufactured by the above-mentioned formation. According to the present invention, electrons could be emitted with a low voltage. An electron source could be formed with actual voltages Vg=20 V and Va=10 kV and the distance H between the electron-emitting device and the anode 12 set to 1 mm.

Here, although an electron-emitting part is described as a substantially circular hole as shown in FIGS. 16A and 16B, a shape of this electron-emitting part is not specifically limited and it may be formed in, for example, a line shape. A manufacturing method is completely the same except that only a patterning shape is changed. It is also possible to arrange a plurality of line patterns and it becomes possible to secure a large emission area.

Eighth Embodiment

Figure 19A:
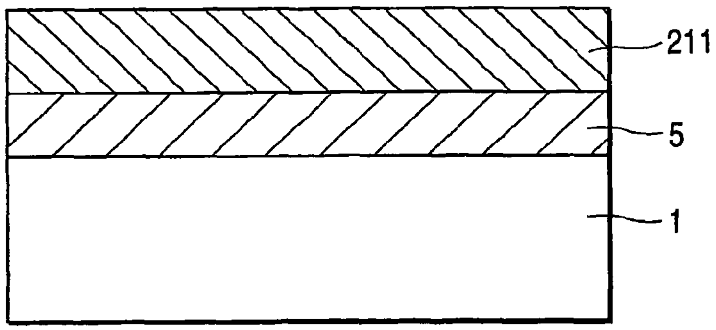
FIGS. 19A, 19B, and 19C are schematic sectional views showing an example of a manufacturing method in accordance with the present invention.

A manufacturing process of an electron-emitting device manufactured according to this embodiment will be described in detail using FIGS. 19A to 19C.

First, quartz was used as a substrate 1 and, after sufficiently cleaning the substrate 1, a film of Ta with a thickness of 500 nm was formed as a cathode electrode 5 by the sputtering method. Subsequently, a carbon layer 211 containing 0.8% cobalt was deposited on the cathode electrode 5 using a carbon target containing cobalt with a cobalt concentration of 1.0% and a target of graphite by the sputtering method (FIG. 19A).

Figure 19B:
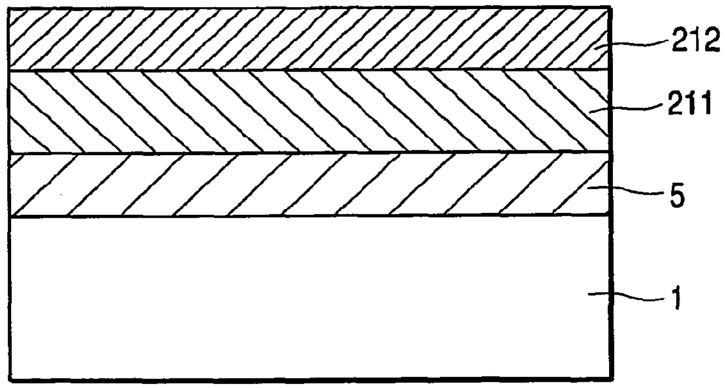

Subsequently, a carbon layer 212 not containing cobalt was deposited to have a thickness of several tens nm on the carbon layer 211 by using only a graphite target (FIG. 19B).

Figure 19C:
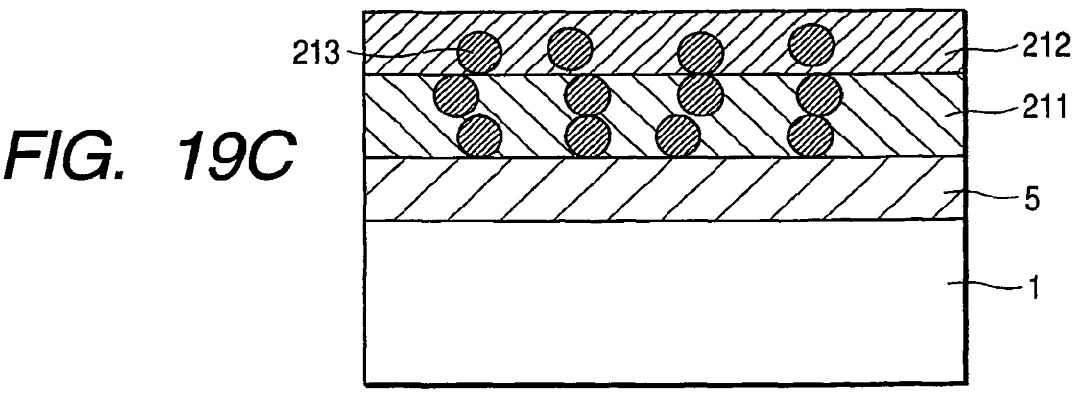

Next, the substrate was subjected to heat treatment by lamp heating at 600° C. for 60 minutes in a mixed gas atmosphere of acetylene and hydrogen to form particulates 213 containing Co as a main body in the layer 211 so as to overlap in a film thickness direction (FIG. 19C).

As in this embodiment, the carbon layer 211 containing cobalt is coated by the carbon layer 212 not containing cobalt, whereby a carbon film containing cobalt of a higher concentration can be manufactured while suppressing growth of a foreign body on the surface of the layer 211. A concentration of cobalt particles in the layers (areas denoted by 211 and 212) formed in this embodiment was $P=3\times10^{17}/cm^3$ according to the TEM observation. In addition, after arranging the anode electrode so as to be opposed to the electron-emitting device (the cathode electrode 5 and the carbon films (211 and 212)) manufactured in this embodiment, when a voltage was applied between the cathode electrode and the anode electrode to measure an electron-emitting characteristic, an electron-emitting site density could be improved.

Ninth Embodiment

Carbon films (211, 212) were formed using the same film formation apparatus as that in the eighth embodiment. However, in this embodiment, the rf power of the carbon target containing cobalt was changed from 100 W to 700 W as time elapsed and an area of a low cobalt concentration was formed in the vicinity of an interface of a substrate 1 to form a high resistance film. As a result, fluctuation at the time of electron emission was reduced and a stable electron-emitting characteristic was obtained.

Tenth Embodiment

Figure 20:
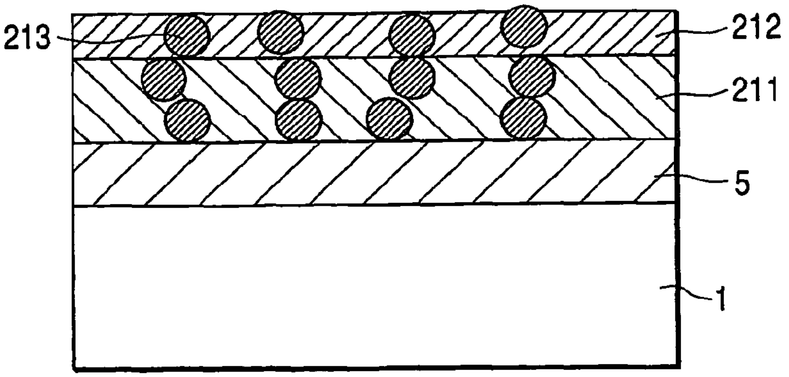
FIG. 20 is a schematic sectional view showing an example of the electron-emitting device in accordance with the present invention.

Carbon films (211, 212) were formed on a cathode electrode 5 under the same conditions as those in the eighth embodiment, and a substrate was subjected to heat treatment by lamp heating in a mixed gas atmosphere of acetylene and hydrogen. However, in this embodiment, a carbon layer not containing cobalt was removed by hydrogen plasma after the heat treatment to expose a part of cobalt particles such that electrons were emitted to the vacuum more easily (see FIG. 20). As a result, an electron-emitting film capable of emitting electrons with a lower electric field was formed.

Eleventh Embodiment

Figure 21:
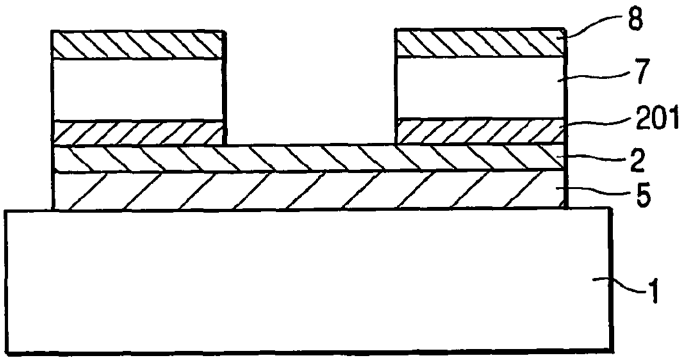
FIG. 21 is a schematic sectional view showing an example of the electron-emitting device in accordance with the present invention.
Figure 22:
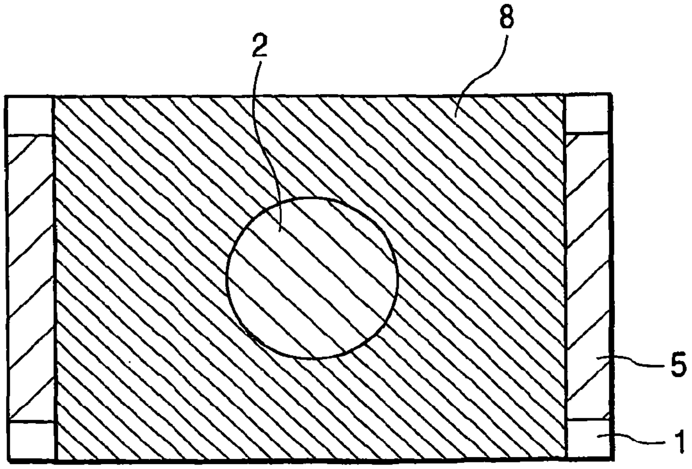
FIG. 22 is a schematic plan view showing an example of the electron-emitting device in accordance with the present invention.

Schematic views of an electron-emitting device manufactured according to this embodiment are shown in FIGS. 21 and 22. FIG. 21 is a schematic sectional view and FIG. 22 is a schematic plan view.

Reference numeral 1 denotes a substrate; 2, an electron-emitting film; 5, a cathode electrode; 7, an insulating layer; 8, a gate electrode; and 210, a focusing electrode. By providing the focusing electrode 201, an electron beam of higher precision can be obtained.

A manufacturing method of the electron-emitting device manufactured in this embodiment will be described using FIGS. 23A to 23D.

First, a Ta electrode is deposited to have a thickness of 500 nm on the quartz substrate 1 by the sputtering method to form the cathode electrode 5. Subsequently, a diamond-like-carbon film (DLC film) 2 was formed to have a thickness of 25 nm by the heat filament CVD method (HFCVD method), and then, Al was deposited to have a thickness of 25 nm by the sputtering method to form the focusing electrode 201. Subsequently, the silicon oxide film 7 was deposited to have a thickness of 500 nm and Ta was deposited to have a thickness of 100 nm as the gate electrode 8 to form a laminated structure shown in FIG. 23A.

Figure 23A:
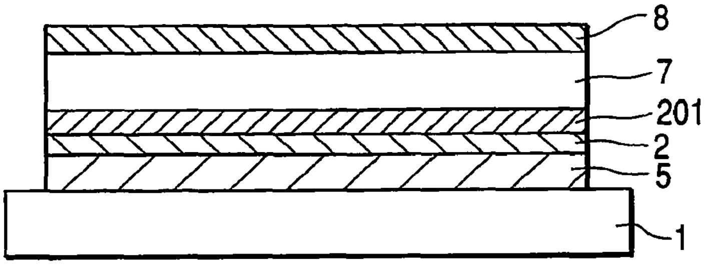
FIGS. 23A, 23B, 23C, and 23D are schematic sectional views showing an example of the manufacturing method in accordance with the present invention.
Figure 23B:
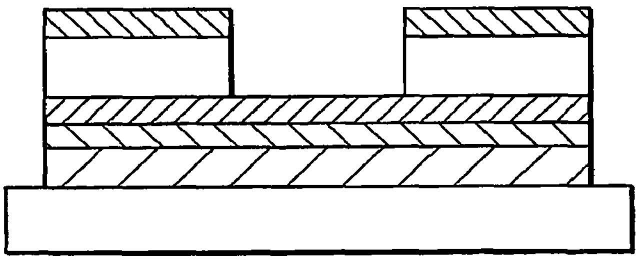

Next, opening areas of $\phi 1$ μm were formed in the Ta film 8 and the silicon oxide film 7 by the photolithography (FIG. 23B). More specifically, the formation of the opening areas was stopped at the point when the substrate was removed up to the silicon oxide film by etching.

Figure 23C:
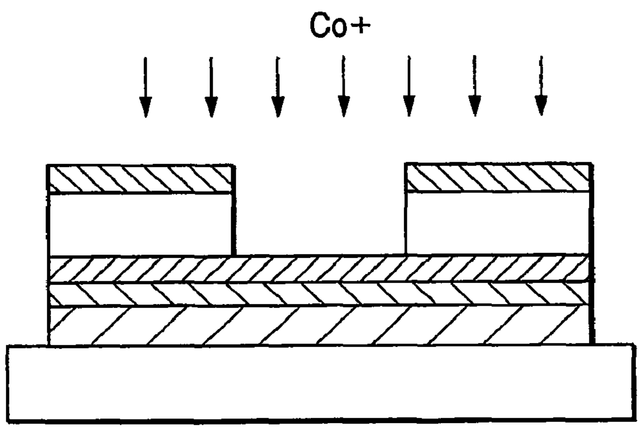

Next, cobalt ions were injected into the laminated structure by the ion implantation method at 25 keV with a dose amount of $5\times10^{15}/cm^2$ (FIG. 23C). In this embodiment, since Co ions were injected into the carbon film 2 in a state in which the Al layer 201 was arranged, a Co concentration can be set simply so as to be the highest in the vicinity of the surface of the carbon film 2.

Figure 23D:
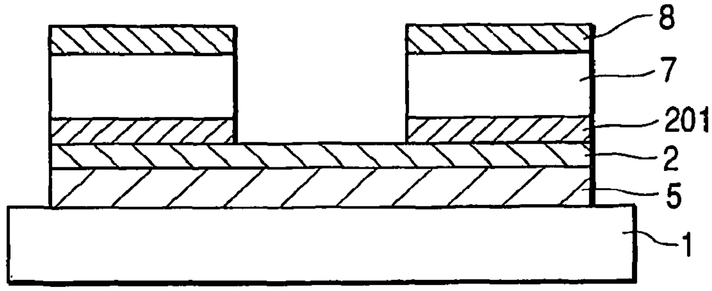

Subsequently, after etching to remove the Al layer 201 with phosphoric acid, the carbon film 2 was subjected to heat treatment by lamp heating in a mixed gas atmosphere of acetylene and hydrogen (FIG. 23D).

When the electron-emitting device thus manufactured was arranged in a vacuum container, and a voltage of 3 kV was applied to an anode electrode (having phosphors on its surface) arranged in a position 1 mm apart from the cathode electrode 5 and, at the same time, a potential for extracting electrons from the carbon film 2 was applied to the gate electrode 8, whereby electrons were emitted toward the anode electrode from the carbon film 2 to drive the device, an emitted light image was observed in the phosphors. When this result was compared with the emitted light image of electron beams emitted from the electron-emitting device manufactured in the seventh embodiment, a beam size (emitted light image) was reduced and high precision was achieved.

According to this embodiment, by using the focusing electrode 201 together with an ion implantation mask, high precision and simplification of a manufacturing process was achieved and low cost was realized.

Twelfth Embodiment

In this embodiment, the surface of the carbon film 2 in the second embodiment was actively terminated with hydrogen. More specifically, the heat treatment in the mixed gas atmosphere of acetylene and hydrogen in the second embodiment was replaced by heat treatment at 60 degrees for 60 minutes in an atmosphere of a total pressure of 7 Kpa (70% methane and 30% hydrogen). The other parts of manufacturing process are the same as those of the second embodiment.

When a characteristic of electron emission from the carbon film manufactured according to this embodiment was measured in the same manner as that of the second embodiment, a voltage at which electron emission was started was halved and, at the same time, an electron emission amount itself, which was obtained when the same potential as the potential applied to the carbon film 2 of the second embodiment was applied, also increased and an ESD also increased by two digits.

Note that, although the heat treatment in the mixed atmosphere of hydrocarbon and hydrogen under the above-mentioned conditions was described in this embodiment as the hydrogen termination treatment on the surface of the carbon film (layer) 2, hydrogen termination treatment is not limited to the above-mentioned example. The hydrogen termination treatment may be performed according to other method.

Thirteenth Embodiment

The image display apparatus was manufactured using the electron-emitting device manufactured in the above-mentioned seventh embodiment. The devices described in the seventh embodiment were arranged in a matrix shape of 100×100. The wirings on the X side were connected to the cathode electrode 5 and the wirings on the Y side were connected to the gate electrode 8 as shown in FIG. 5. The devices were arranged at a pitch of 300 μm horizontally and 300 μm vertically. Phosphors were arranged above the devices. As a result, an image display apparatus, which could be driven in matrix and is high in luminance and precision, could be formed.

Fourteenth Embodiment

Schematic views of an electron-emitting device manufactured according to this embodiment are shown in FIGS. 24A to 24D and 25. FIGS. 24A to 24D are schematic sectional views of a manufacturing process of the electron-emitting device manufactured in this embodiment. FIG. 25 is a schematic plan view of the electron-emitting device obtained in FIGS. 24A to 24D.

A manufacturing method for the electron-emitting device manufactured in this embodiment will be described using FIGS. 24A to 24D.

First, a conductive film 241 composed of Ta was deposited to have a thickness of 100 nm using the sputtering method on an insulating substrate 1. Subsequently, after a carbon film 2 was formed to have a thickness of 35 nm on the conductive film composed of Ta by the heat filament CVD method (HFCVD method), an insulating layer composed of a silicon oxide film 242 was deposited to have a thickness of 30 nm on the carbon film.

Figure 24A:
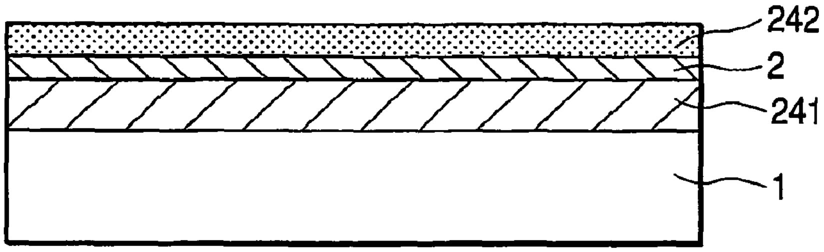
FIGS. 24A, 24B, 24C, and 24D are schematic sectional views showing an example of the manufacturing method in accordance with the present invention.
Figure 24B:
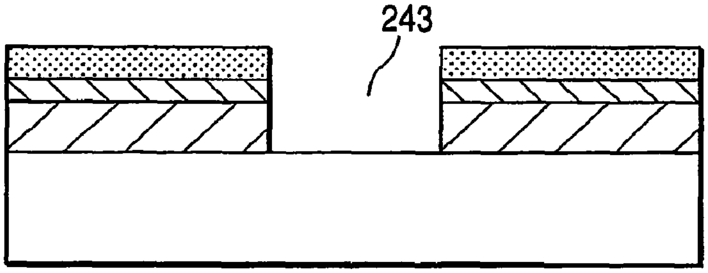
Figure 24C:
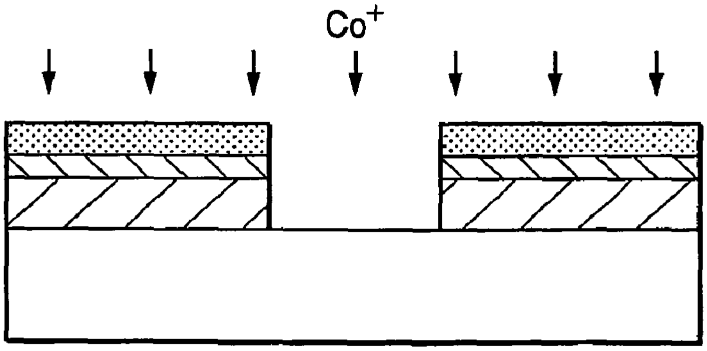

Next, a gap 243 with a width W of 2 μm was formed in the silicon oxide film, the carbon film, and the conductive film by the photolithography (FIG. 24B).

Next, after removing a resist, cobalt ions were implanted into a laminated body of the carbon film and the silicon oxide film layer at 25 keV and with a dose amount of $1\times10^{15}/cm^2$ (FIG. 24C) by ion implantation method. In this embodiment, since the Co ions were implanted into the carbon film in a state in which the silicon oxide film layer was arranged, a Co concentration could be easily set so as to be the highest in the vicinity of the surface of the carbon film.

Subsequently, after etching to remove the silicon oxide film layer, the carbon film 2 was subjected to heat treatment by lamp heating in a mixed gas atmosphere of acetylene and hydrogen (FIG. 24D). According to this process, there was formed the layer 2 in which a plurality of Co particles were arranged in a film thickness direction.

When electrons were emitted to be driven from the layer 2 by setting the electron-emitting device thus manufactured in a vacuum container, applying a voltage of 5 kV to an anode electrode (having phosphors on its surface) arranged in a position 1 mm apart upward from the substrate 1 and, at the same time, applying a drive voltage to the cathode electrode 5 and the gate electrode 8, an emitted light image from the phosphors could be observed with a low drive voltage.

Note that, although a form in which the layer 2 remains on the gate electrode 8 is described in this embodiment, it is not always necessary that the layer 2 remains on the gate electrode 8.

EFFECTS OF THE INVENTION

As described above, the present invention can provide an electron-emitting device which does not include a process of conditioning and is capable of emitting electrons with a low threshold value. Moreover, the present invention can provide an electron-emitting device with which the spot size of an electron beam is small, highly efficient electron emission is possible with a low voltage, and a manufacturing process is easy.

In addition, when the electron-emitting device of the present invention is applied to an electron source and an image display apparatus, an electron source and an image display apparatus excellent in performance can be realized.

What is claimed is:

1. A manufacturing method for an electron-emitting device, comprising:

preparing a carbon layer on a cathode electrode;

implanting metal into the carbon layer by ion implantation method so that a film containing metal and carbon as a main component is formed on the cathode electrode, and heating the film in an atmosphere containing hydrogen, after the metal-implanting step, wherein the metal is contained in the film before being subjected to the heating, at a ratio of 0.001 atm % or more and 5 atm % or less with respect to the carbon element, and wherein groups of particles of said metal are formed discretely in the film by said heating.

2. A manufacturing method for an electron-emitting device, comprising:

preparing a carbon layer on a cathode electrode;

implanting metal into the carbon layer by ion implantation method so that a film containing metal and carbon as a main component is formed on the cathode electrode, and heating the film in an atmosphere containing hydrogen, after the metal-implanting step, wherein the metal is contained in the film before the film is subjected to the heating, at a ratio of 0.001 atm % or more and 1.5 atm % or less with respect to the carbon element, and wherein groups of particles of said metal are formed discretely in the film by said heating.

* * * * *